United States Patent
Mikawa et al.

(10) Patent No.: US 6,891,715 B2
(45) Date of Patent: May 10, 2005

(54) CAPACITOR AND METHOD FOR FABRICATING THE SAME

(75) Inventors: Takumi Mikawa, Shiga (JP); Yuji Judai, Kyoto (JP); Shinichiro Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/607,313

(22) Filed: Jun. 27, 2003

(65) Prior Publication Data
US 2004/0004793 A1 Jan. 8, 2004

(30) Foreign Application Priority Data

Jul. 8, 2002 (JP) ........................................ 2002-198125

(51) Int. Cl.$^7$ ................................................. H01G 4/06
(52) U.S. Cl. ....................... 361/311; 361/312; 29/25.41; 257/295
(58) Field of Search ...................... 361/306.3, 311–313, 361/321.2; 257/295–296, 532, 306, 310

(56) References Cited

U.S. PATENT DOCUMENTS

| 5,973,911 | A | * | 10/1999 | Nishioka | ..................... | 361/313 |
| 6,072,689 | A | * | 6/2000 | Kirlin | ........................ | 361/311 |
| 6,184,927 | B1 | * | 2/2001 | Kang | .................... | 348/240.99 |
| 6,597,029 | B2 | * | 7/2003 | Kim et al. | .................. | 257/295 |

FOREIGN PATENT DOCUMENTS

| JP | 11-8355 | 1/1999 |
| JP | 2001-267519 | 9/2001 |

* cited by examiner

Primary Examiner—Anthony Dinkins
(74) Attorney, Agent, or Firm—McDermott Will & Emery LLP

(57) ABSTRACT

A capacitor is formed on an interlayer insulating film formed on a semiconductor substrate. The capacitor includes a bottom electrode made of platinum, a capacitor insulating film made of SrTaBiO (SBT) containing an element absorbing hydrogen such as titanium, for example, in grain boundaries, inter-lattice positions or holes, and a top electrode made of platinum.

5 Claims, 18 Drawing Sheets

CAPACITOR AND METHOD FOR FABRICATING THE SAME

BACKGROUND OF THE INVENTION

The present invention relates to a capacitor having a capacitor insulating film composed of a ferroelectric film or a high dielectric constant film and in particular a capacitor used for a ferroelectric memory or a high dielectric memory, and a method for fabricating the same.

As for ferroelectric memories, mass-production has started for ferroelectric memories of a planer structure having a capacity of 1 to 64 Kbits. In recent years, ferroelectric memories of a stack structure having a large capacity of 256 Kbits to 4 Mbits have become dominant in development. To implement stack-type ferroelectric memories, it is indispensable to substantially improve the scale of integration and hence provide finer ferroelectric memories. To achieve this, it is important to secure conformity among the step of forming ferroelectric capacitors, the step of forming transistors and the wiring step.

In relation to the above, the following problem arises. That is, ferroelectric capacitors must keep their ferroelectric films from being reduced to maintain the polarization property of the ferroelectric films in a semiconductor process, in which processing is often performed in a hydrogen atmosphere, as is typified by processing of embedding contacts using W-CVD and heat treatment in a hydrogen atmosphere for recovery of the properties of transistors, for example.

FIG. 18 shows the degree of degradation of the polarization observed when heat treatment at a temperature of 400° C. in a hydrogen atmosphere, which is normally adopted in the wiring step for semiconductor devices, is performed for a ferroelectric capacitor having a bottom electrode made of Pt, a capacitor insulating film made of SBT and a top electrode made of Pt. In FIG. 18, the y-axis represents the polarization 2Pr ($\mu C/cm^2$) and the x-axis represents the hydrogen mixture ratio.

As is apparent from FIG. 18, degradation of the polarization begins when the hydrogen mixture ratio is 0.001%, and a complete short circuit occurs when it is 0.5% or more. From these results, it is found how a ferroelectric film is sensitive to hydrogen.

Conventionally, a technique of coating a ferroelectric capacitor with a hydrogen barrier film is generally adopted, as is described in Japanese Laid-Open Patent Publication No. 11-8355, for example. By this coating, diffusion of hydrogen generated in a semiconductor process after formation of a ferroelectric capacitor is blocked with a hydrogen barrier film, which is typically an $Al_2O_3$ film, and thus degradation of the polarization of the ferroelectric film is prevented. This effect is provided most greatly for a structure of the ferroelectric capacitor completely covered with the hydrogen barrier film. In this way, degradation of the polarization property of the ferroelectric capacitor due to hydrogen is prevented, and thus a highly integrated ferroelectric memory or high dielectric memory is realized.

A conventional ferroelectric capacitor of a completely covered structure will be described with reference to FIG. 19.

Referring to FIG. 19, a first interlayer insulating film 201 is formed on a semiconductor substrate 200 on which a memory cell transistor (of which illustration is omitted) is formed, and a first hydrogen barrier film 202 is formed on the first interlayer insulating film 201. On the first hydrogen barrier film 202, formed is a ferroelectric capacitor having a bottom electrode 203, a capacitor insulating film 204 composed of a ferroelectric film, and a top electrode 205. The top surface and side faces of the ferroelectric capacitor are covered with a second hydrogen barrier film 206. Thus, the ferroelectric capacitor is completely covered with the first hydrogen barrier film 202 and the second hydrogen barrier film 206.

A second interlayer insulating film 207 is formed covering the second hydrogen barrier film 206, and a metal interconnection 209 is formed on the second interlayer insulating film 207 via a barrier layer 208. A first contact plug 211 extends through the first interlayer insulating film 201 and the first hydrogen barrier film 202, for connecting the memory cell transistor with the bottom electrode 203. A second contact plug 212 extends through the second interlayer insulating film 207 and the second hydrogen barrier film 206, for connecting the top electrode 205 with the metal interconnection 209.

Since the conventional ferroelectric capacitor is completely covered with the first and second hydrogen barrier films 202 and 206, diffusion of hydrogen into the capacitor insulating film 204 is suppressed even when the ferroelectric capacitor is subjected to heat treatment in a reducing atmosphere. In this way, degradation of the polarization property of the ferroelectric film constituting the capacitor insulating film 204 can be reduced.

In the prior art described above, the ferroelectric capacitor was completely covered with the hydrogen barrier films. For reducing the number of steps, reducing the cost and facilitating the integration, there is also known a structure of the ferroelectric capacitor of which only the top surface is covered with a hydrogen barrier film.

The conventional ferroelectric capacitor described above however has the following problem. The inventors of the present invention performed heat treatment for a ferroelectric capacitor covered with hydrogen barrier films as described above in a reducing atmosphere, and found that it was not possible to prevent completely the degradation of the polarization property of a ferroelectric film constituting the capacitor insulating film.

FIG. 20 shows the results of the properties of a ferroelectric capacitor covered with hydrogen barrier films, measured before and after heat treatment performed for the ferroelectric capacitor in a hydrogen atmosphere. In this experiment, heat treatment in a 4% hydrogen atmosphere was performed for a ferroelectric capacitor having the structure shown in FIG. 19, in which a Pt/IrOx/Ir/TiAlN laminated film was used as the bottom electrode 13, an SBTN film was used as the capacitor insulating film 14, a Pt film was used as the top electrode 15, a plasma silicon nitride film was used as the first hydrogen barrier film 12, and an aluminum titanium oxide film was used as the second hydrogen barrier film 16. In FIG. 20, 2Pr represents the polarization ($\mu C/cm^2$), Pnv represents the saturated polarization ($\mu C/cm^2$) observed when the no-voltage applied state continues sufficiently long, and BVF represents the breakdown voltage (V) observed when a current of $10^{-7}$ $A/cm^2$ flows to the ferroelectric capacitor.

Considering the experiment results shown in FIG. 18, it is found that in the experiment shown in FIG. 20, 0.001% or less of hydrogen entered the ferroelectric film and the concentration of hydrogen entering the ferroelectric film was reduced to 4000/1 or less thanks to the hydrogen barrier films. From the experiment results shown in FIG. 20, it is also found that degradation of the ferroelectric film cannot be completely prevented even when the ferroelectric capacitor is covered with the hydrogen barrier films.

In view of the above, the present inventors have examined paths through which hydrogen enters the ferroelectric film, and found that hydrogen diffuses into the ferroelectric film via a first diffusion path passing via the first contact plug 211 and the second contact plug 212, a second diffusion path composed of an interface between the first hydrogen barrier film 202 and the second hydrogen barrier film 206, and a third diffusion path composed of grain boundaries of the first hydrogen barrier film 202 poor in crystallinity due to a step formed on a layer underlying the first hydrogen barrier film 202.

As for the first diffusion path via the contact plugs, conductive hydrogen barrier films may be provided right above the top electrode and right below the bottom electrode. However, for the remaining diffusion paths, there exist problems considerably difficult to solve that the crystallinity must be improved at the step and that the cohesion between the dense hydrogen barrier films must be improved.

As described above, even when a ferroelectric capacitor is completely covered with hydrogen barrier films, it is not possible to prevent completely degradation of the polarization property of a ferroelectric film constituting the capacitor insulating film of the ferroelectric capacitor when the ferroelectric capacitor is subjected to heat treatment in a reducing atmosphere.

SUMMARY OF THE INVENTION

An object of the present invention is providing a ferroelectric capacitor in which degradation of the polarization property of a ferroelectric film or a high dielectric constant film constituting the capacitor insulating film is prevented without fail even when the ferroelectric capacitor is subjected to heat treatment in a reducing atmosphere.

To attain the object described above, the capacitor of the present invention has a laminated structure including a bottom electrode, a capacitor insulating film composed of a ferroelectric film or a high dielectric constant film formed on the bottom electrode, and a top electrode formed on the capacitor insulating film, wherein an element absorbing hydrogen is contained in the capacitor insulating film.

According to the capacitor of the present invention, which has a laminated structure including the bottom electrode, the capacitor insulating film composed of a ferroelectric film or a high dielectric constant film and a top electrode, when the capacitor is subjected to heat treatment in a hydrogen atmosphere, hydrogen that entered the capacitor insulating film, if any, is absorbed by the hydrogen-absorbing element. Thus, degradation of the polarization property of the capacitor insulating film due to hydrogen can be prevented.

In the capacitor of the present invention, the element absorbing hydrogen is preferably contained in grain boundaries, inter-lattice positions or holes of the capacitor insulating film.

By arranging as described above, hydrogen that entered the capacitor insulating film is absorbed by the hydrogen-absorbing element without fail. This ensures prevention of degradation of the polarization property of the capacitor insulating film due to hydrogen.

In the capacitor of the present invention, the element absorbing hydrogen is preferably bonded with oxygen.

By arranging as described above, hydrogen that entered the capacitor insulating film first acts to dissociate the oxygen from the hydrogen-absorbing element, that is, the hydrogen is consumed to reduce the hydrogen-absorbing element. Therefore, degradation of the polarization property of the capacitor insulating film due to hydrogen can be further prevented.

In the capacitor of the present invention, preferably, the capacitor insulating film is made of SBT, and the element absorbing hydrogen is at least one selected from the group consisting of Sc, Ti, V, Y, Zr, Nb and La.

The elements described above are high in hydrogen absorbing capability. Therefore, with any of these elements contained in the capacitor insulating film made of SBT, degradation of the polarization property of the capacitor insulating film due to hydrogen can be prevented further effectively.

Preferably, the capacitor of the present invention further includes a hydrogen barrier film covering at least part of the laminated structure.

With the hydrogen barrier film, most of the hydrogen in the atmosphere is blocked from entering the capacitor. In addition, if hydrogen enters the capacitor insulating film through grain boundaries generated at poorly coated positions in the hydrogen barrier film or through the joint interface between hydrogen barrier films, such hydrogen is absorbed by the hydrogen-absorbing element. Therefore, degradation of the polarization property of the capacitor insulating film due to hydrogen can be prevented further effectively.

The first method for fabricating a capacitor of the present invention includes the steps of: forming a laminated structure including a bottom electrode, a capacitor insulating film formed on the bottom electrode, and a top electrode formed on the capacitor insulating film, the capacitor insulating film being composed of a ferroelectric film or a high dielectric constant film containing an element absorbing hydrogen; and subjecting the capacitor insulating film to heat treatment to crystallize the ferroelectric film or the high dielectric constant film and place the element absorbing hydrogen in grain boundaries, inter-lattice positions or holes of the ferroelectric film or the high dielectric constant film.

The second method for fabricating a capacitor of the present invention includes the steps of: forming a bottom electrode or a first conductive film from which a bottom electrode is formed and then depositing a ferroelectric film or a high dielectric constant film containing an element absorbing hydrogen on the bottom electrode or the first conductive film; subjecting the ferroelectric film or high dielectric constant film to heat treatment to crystallize the ferroelectric film or the high dielectric constant film and place the element absorbing hydrogen in grain boundaries, inter-lattice positions or holes of the ferroelectric film or the high dielectric constant film; depositing a second conductive film on the crystallized ferroelectric film or high dielectric constant film; forming a top electrode by patterning the second conductive film; and forming a capacitor insulating film by patterning the crystallized ferroelectric film or high dielectric constant film.

The third method for fabricating a capacitor of the present invention includes the steps of: forming a bottom electrode or a first conductive film from which a bottom electrode is formed and depositing a ferroelectric film or a high dielectric constant film containing an element absorbing hydrogen on the bottom electrode or the first conductive film; depositing a second conductive film on the ferroelectric film or the high dielectric constant film; subjecting the ferroelectric film or high dielectric constant film to heat treatment to crystallize the ferroelectric film or the high dielectric constant film and place the element absorbing hydrogen in grain boundaries, inter-lattice positions or holes of the ferroelectric film or the high dielectric constant film; forming a top electrode by patterning the second conductive film; and forming a capacitor insulating film by patterning the crystallized ferroelectric film or high dielectric constant film.

The fourth method for fabricating a capacitor of the present invention includes the steps of: forming a bottom electrode or a first conductive film from which a bottom electrode is formed and depositing a ferroelectric film or a high dielectric constant film containing an element absorbing hydrogen on the bottom electrode or the first conductive film; subjecting the ferroelectric film or high dielectric constant film to heat treatment to crystallize the ferroelectric film or the high dielectric constant film and place the element absorbing hydrogen in grain boundaries, inter-lattice positions or holes of the ferroelectric film or the high dielectric constant film; forming a capacitor insulating film by patterning the crystallized ferroelectric film or high dielectric constant film; depositing a second conductive film on the capacitor insulating film; and forming a top electrode by patterning the second conductive film.

The fifth method for fabricating a capacitor of the present invention includes the steps of forming a bottom electrode or a first conductive film from which a bottom electrode is formed and depositing a ferroelectric film or a high dielectric constant film containing an element absorbing hydrogen on the bottom electrode or the first conductive film; forming a capacitor insulating film by patterning the ferroelectric film or the high dielectric constant film; subjecting the ferroelectric film or high dielectric constant film to heat treatment to crystallize the ferroelectric film or the high dielectric constant film and place the element absorbing hydrogen in grain boundaries, inter-lattice positions or holes of the ferroelectric film or the high dielectric constant film; depositing a second conductive film on the capacitor insulating film as the crystallized ferroelectric film or high dielectric constant film; and forming a top electrode by patterning the second conductive film.

The sixth method for fabricating a capacitor of the present invention includes the steps of: forming a laminated structure comprising a bottom electrode, a hydrogen-absorbing element layer containing an element absorbing hydrogen formed on the bottom electrode, a capacitor insulating film composed of a ferroelectric film or a high dielectric constant film formed on the hydrogen-absorbing element layer, and a top electrode formed on the capacitor insulating film; and subjecting the capacitor insulating film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film.

The seventh method for fabricating a capacitor of the present invention includes the steps of: forming a bottom electrode or a first conductive film from which a bottom electrode is formed and depositing a hydrogen-absorbing element layer containing an element absorbing hydrogen on the bottom electrode or the first conductive film; depositing a ferroelectric film or a high dielectric constant film on the hydrogen-absorbing element layer; subjecting the ferroelectric film or high dielectric constant film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; depositing a second conductive film on the crystallized ferroelectric film or high dielectric constant film; forming a top electrode by patterning the second conductive film; and forming a capacitor insulating film by patterning the crystallized ferroelectric film or high dielectric constant film.

The eighth method for fabricating a capacitor of the present invention includes the steps of: forming a bottom electrode or a first conductive film from which a bottom electrode is formed and depositing a hydrogen-absorbing element layer containing an element absorbing hydrogen on the bottom electrode or the first conductive film; depositing a ferroelectric film or a high dielectric constant film on the hydrogen-absorbing element layer; depositing a second conductive film on the ferroelectric film or the high dielectric constant film; subjecting the ferroelectric film or high dielectric constant film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; forming a top electrode by patterning the second conductive film; and forming a capacitor insulating film by patterning the crystallized ferroelectric film or high dielectric constant film.

The ninth method for fabricating a capacitor of the present invention includes the steps of: forming a bottom electrode or a first conductive film from which a bottom electrode is formed and depositing a hydrogen-absorbing element layer containing an element absorbing hydrogen on the bottom electrode or the first conductive film; depositing a ferroelectric film or a high dielectric constant film on the hydrogen-absorbing element layer; subjecting the ferroelectric film or high dielectric constant film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; forming a capacitor insulating film by patterning the crystallized ferroelectric film or high dielectric constant film; depositing a second conductive film on the capacitor insulating film; and forming a top electrode by patterning the second conductive film.

The tenth method for fabricating a capacitor of the present invention includes the steps of: forming a bottom electrode or a first conductive film from which a bottom electrode is formed and depositing a hydrogen-absorbing element layer containing an element absorbing hydrogen on the bottom electrode or the first conductive film; depositing a ferroelectric film or a high dielectric constant film on the hydrogen-absorbing element layer; forming a capacitor insulating film by patterning the ferroelectric film or the high dielectric constant film; subjecting the capacitor insulating film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; depositing a second conductive film on the capacitor insulating film as the crystallized ferroelectric film or high dielectric constant film; and forming a top electrode by patterning the second conductive film.

The eleventh method for fabricating a capacitor of the present invention includes the steps of: forming a laminated structure comprising a bottom electrode, a capacitor insulating film composed of a ferroelectric film or a high dielectric constant film formed on the bottom electrode, a hydrogen-absorbing element layer containing an element absorbing hydrogen formed on the capacitor insulating film, and a top electrode formed on the hydrogen-absorbing element layer; and subjecting the capacitor insulating film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film.

The twelfth method for fabricating a capacitor of the present invention includes the steps of: forming a bottom electrode or a first conductive film from which a bottom electrode is formed and depositing a ferroelectric film or a high dielectric constant film on the bottom electrode or the first conductive film; depositing a hydrogen-absorbing element layer containing an element absorbing hydrogen on the ferroelectric film or the high dielectric constant film; subjecting the ferroelectric film or high dielectric constant film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; depositing a second conductive film on the crystallized ferroelectric film or high dielectric constant film; forming a top electrode by patterning the second conductive film; and forming a capacitor insulating film by patterning the crystallized ferroelectric film or high dielectric constant film.

The thirteenth method for fabricating a capacitor of the present invention includes the steps of: forming a bottom electrode or a first conductive film from which a bottom electrode is formed and depositing a ferroelectric film or a high dielectric constant film on the bottom electrode or the first conductive film; depositing a hydrogen-absorbing element layer containing an element absorbing hydrogen on the ferroelectric film or the high dielectric constant film; depositing a second conductive film on the hydrogen-absorbing element layer; subjecting the ferroelectric film or high dielectric constant film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; forming a top electrode by patterning the second conductive film; and forming a capacitor insulating film by patterning the crystallized ferroelectric film or high dielectric constant film.

The fourteenth method for fabricating a capacitor of the present invention includes the steps of: forming a bottom electrode or a first conductive film from which a bottom electrode is formed and depositing a ferroelectric film or a high dielectric constant film on the bottom electrode or the first conductive film; depositing a hydrogen-absorbing element layer containing an element absorbing hydrogen on the ferroelectric film or the high dielectric constant film; subjecting the ferroelectric film or high dielectric constant film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; forming a capacitor insulating film by patterning the crystallized ferroelectric film or high dielectric constant film; depositing a second conductive film on the capacitor insulating film; and forming a top electrode by patterning the second conductive film.

The fifteenth method for fabricating a capacitor of the present invention includes the steps of: forming a bottom electrode or a first conductive film from which a bottom electrode is formed and depositing a ferroelectric film or a high dielectric constant film on the bottom electrode or the first conductive film; depositing a hydrogen-absorbing element layer containing an element absorbing hydrogen on the ferroelectric film or the high dielectric constant film; forming a capacitor insulating film by patterning the ferroelectric film or the high dielectric constant film; subjecting the capacitor insulating film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film; depositing a second conductive film on the capacitor insulating film as the crystallized ferroelectric film or high dielectric constant film; and forming a top electrode by patterning the second conductive film.

The sixteenth method for fabricating a capacitor of the present invention includes the steps of: forming a laminated structure including a bottom electrode, a capacitor insulating film composed of a ferroelectric film or a high dielectric constant film formed on the bottom electrode, and a top electrode formed on the capacitor insulating film; depositing a hydrogen-absorbing element layer containing an element absorbing hydrogen to cover the laminated structure; and subjecting the capacitor insulating film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film.

The seventeenth method for fabricating a capacitor of the present invention includes the steps of forming a bottom electrode or a first conductive film from which a bottom electrode is formed on a semiconductor substrate and depositing a ferroelectric film or a high dielectric constant film on the bottom electrode or the first conductive film; depositing a second conductive film on the ferroelectric film or the high dielectric constant film; forming a top electrode by patterning the second conductive film; depositing a hydrogen-absorbing element layer containing an element absorbing hydrogen on the top electrode and on a region of the ferroelectric film or the high dielectric constant film surrounding the top electrode; and subjecting the ferroelectric film or the high dielectric constant film to heat treatment to crystallize the ferroelectric film or the high dielectric constant film and place the element absorbing hydrogen contained in the hydrogen-absorbing element layer in grain boundaries, inter-lattice positions or holes of the ferroelectric film or the high dielectric constant film.

The first to seventeenth methods for fabricating a capacitor of the present invention include the step of subjecting the capacitor insulating film, or the ferroelectric film or the high dielectric constant film to heat treatment, to crystallize the ferroelectric film or the high dielectric constant film and also place the element absorbing hydrogen contained in the hydrogen-absorbing element layer in grain boundaries, inter-lattice positions or holes of the ferroelectric film or the high dielectric constant film. Therefore, if hydrogen enters the capacitor insulating film during heat treatment in a hydrogen atmosphere for the capacitor composed essentially of the bottom electrode, the capacitor insulating film formed of the ferroelectric film or the high dielectric constant film and the top electrode, such hydrogen is absorbed by the hydrogen-absorbing element. In this way, degradation of the polarization property of the capacitor insulating film due to hydrogen can be prevented.

Preferably, the first to sixteenth methods for fabricating a capacitor of the present invention further include the step of forming a hydrogen barrier layer covering at least part of the laminated structure including the bottom electrode, the capacitor insulating film and the top electrode.

With the hydrogen barrier layer, most of the hydrogen in the atmosphere is blocked from entering the capacitor. In addition, if hydrogen enters the capacitor insulating film through grain boundaries generated at poorly coated positions in the hydrogen barrier layer or through the joint interface between hydrogen barrier layers, such hydrogen is absorbed by the hydrogen-absorbing element. Therefore, degradation of the polarization property of the capacitor insulating film due to hydrogen can be prevented further effectively.

DESCRIPTION OF THE PREFERRED EMBODIMENTS (Embodiment 1)

Figure 1:
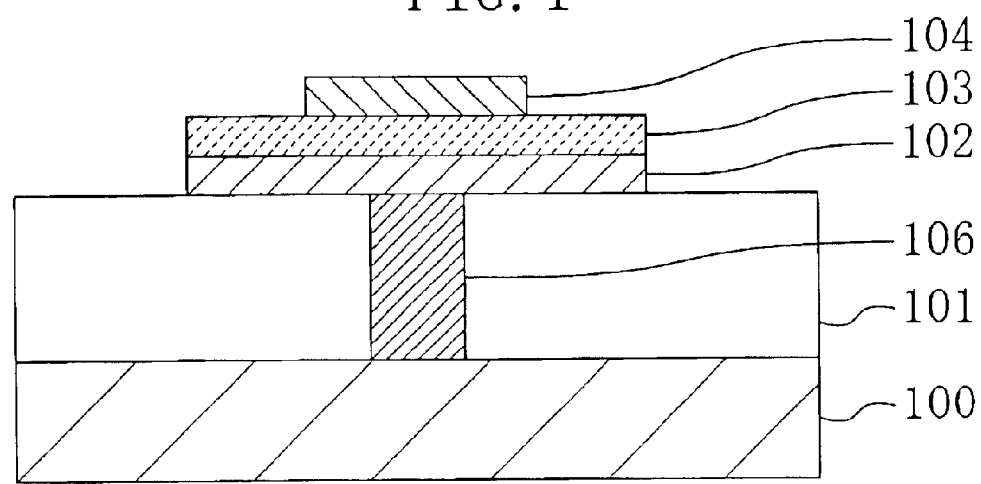
FIG. 1 is a cross-sectional view of a capacitor of Embodiment 1 of the present invention.

Hereinafter, a capacitor of Embodiment 1 of the present invention will be described with reference to FIGS. 1 and 2. FIG. 1 shows a cross-sectional structure of the capacitor of Embodiment 1.

Referring to FIG. 1, an interlayer insulating film 101 composed of a BPSG film, for example, is formed on a semiconductor substrate 100 on which a memory cell transistor (of which illustration is omitted) is formed. On the interlayer insulating film 101, a capacitor is formed. The capacitor has a laminated structure composed of a bottom electrode 102 made of platinum, for example, a capacitor insulating film 103 made of SrTaBiO (SBT) containing 25 wt % of titanium (Ti), for example, in grain boundaries, inter-lattice positions or holes, and a top electrode 104 made of platinum, for example.

A contact plug 106 made of tungsten (W), for example, is embedded in the interlayer insulating film 101, for connecting the memory cell transistor on the semiconductor substrate 100 with the bottom electrode 102 of the capacitor.

Figure 2:
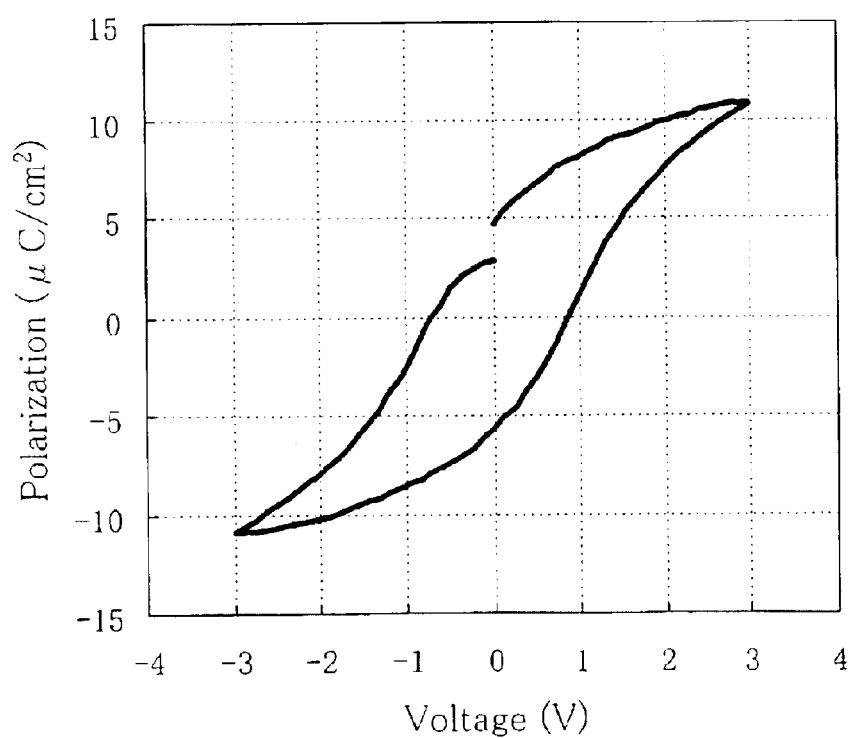
FIG. 2 is a view showing the polarization property of the capacitor of Embodiment 1 observed when the capacitor is subjected to heat treatment in a hydrogen atmosphere having a hydrogen concentration of 0.01%.

FIG. 2 shows the polarization property of the capacitor of Embodiment 1 observed when the capacitor is subjected to heat treatment in a hydrogen atmosphere having a hydrogen concentration of 0.01%. Specifically, FIG. 2 shows the results of an experiment in which a change in polarization was measured by putting probes of the top electrode 104 and the bottom electrode 102 into contact with each other.

From FIG. 2, it is found that by using SBT containing 25 wt % of Ti for the capacitor insulating film 103, the hysteresis property is free from degrading and also no short circuit occurs between the top electrode 104 and the bottom electrode 102. The reason can be determined that Ti existing in grain boundaries in the ferroelectric film absorbed hydrogen and this suppressed reduction of the ferroelectric film.

In Embodiment 1, in which the ferroelectric film constituting the capacitor insulating film 103 contains an element absorbing hydrogen, hydrogen entering the capacitor insulating film 103 is absorbed by the hydrogen-absorbing element and thus does not act to reduce the ferroelectric film. In this way, degradation of the polarization property of the capacitor insulating film 103 due to hydrogen is prevented.

The existence of a metal as the hydrogen-absorbing element in the capacitor insulating film 103 may possibly increase the leakage current of the capacitor. In view of this, the hydrogen-absorbing element is preferably contained in the capacitor insulating film 103 in the state of being bonded with oxygen, that is, in the state of an oxide.

By being in the state described above, the hydrogen-absorbing element is allowed to exist in the capacitor insulating film 103 stably. In addition, hydrogen entering the capacitor insulating film 103 is consumed to dissociate oxygen bonded with the hydrogen-absorbing element. Therefore, degradation of the polarization property of the capacitor insulating film 103 due to hydrogen can be further prevented.

In Embodiment 1, Ti was used singly as the hydrogen-absorbing element. Alternatively, at least one selected from the group consisting of Ti, Sc, V, Zr, Nb and La may be used.
(Embodiment 2)

Figure 3:
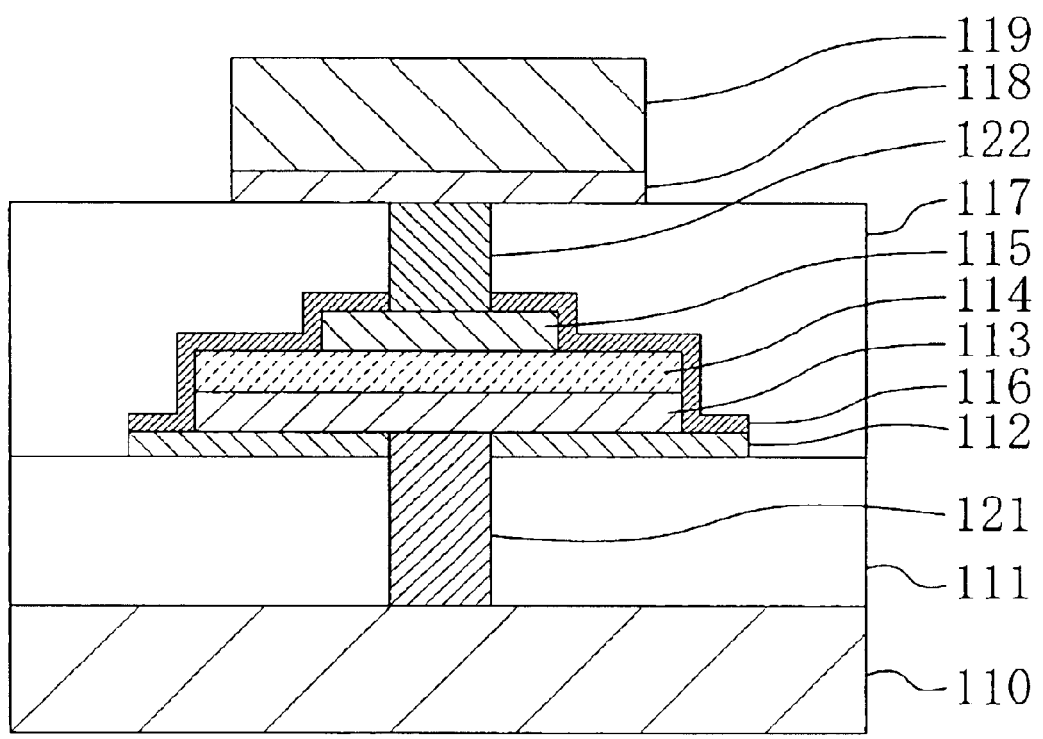
FIG. 3 is a cross-sectional view of a capacitor of Embodiment 2 of the present invention.

Hereinafter, a capacitor of Embodiment 2 of the present invention will be described with reference to FIG. 3. FIG. 3 shows a cross-sectional structure of the capacitor of Embodiment 2.

Referring to FIG. 3, a first interlayer insulating film 111 composed of a BPSG film, for example, is formed on a semiconductor substrate 110 on which a memory cell transistor (of which illustration is omitted) is formed. A first hydrogen barrier film 112 composed of a SiN film, a SiON film, a TiAlO film or an $Al_2O_3$ film is formed on the first interlayer insulating film 111. On the first hydrogen barrier film 112, formed is a capacitor of a laminated structure composed of a bottom electrode 113, a capacitor insulating film 114 and a top electrode 115. The bottom electrode 113 has a double-layer structure composed of a lower barrier layer, which is a single-layer film formed of one of an IrO film, an Ir film, a TiAlN film and a TiN film or a laminated film formed of any of these films, and an upper metal layer formed of a Pt film, for example. The capacitor insulating film 114 is composed of a ferroelectric film containing a hydrogen-absorbing element composed of at least one selected from the group consisting of Ti, Sc, V, Zr, Nb and La. The top electrode 115 is composed of a single-layer film formed of one of a Pt film, an Ir film and an IrO film or a laminated film formed of any of these films.

A second hydrogen barrier film 116 composed of a SiN film, a SiON film, a TiAlO film or an $Al_2O_3$ film is formed covering the capacitor composed of the bottom electrode 113, the capacitor insulating film 114 and the top electrode 115. The periphery of the second hydrogen barrier film 116 is connected with the periphery of the first hydrogen barrier film 112. In this way, the capacitor is covered with the first and second hydrogen barrier films 112 and 116.

A second interlayer insulating film 117 composed of a silicon oxide film or an ozone TEOS film is formed covering the second hydrogen barrier film 116, and a metal interconnection 119 of an Al/TiN/Ti laminated structure is formed on the second interlayer insulating film 117 via a barrier layer 118.

A first contact plug 121 made of tungsten or polysilicon extends through the first interlayer insulating film 111 and the first hydrogen barrier film 112, for connecting the memory cell transistor formed on the semiconductor substrate 110 with the bottom electrode 113 of the capacitor. A second contact plug 122 made of tungsten extends through the second interlayer insulating film 117 and the second hydrogen barrier film 116, for connecting the top electrode 115 of the capacitor with the barrier layer 118 for the metal interconnection 119.

In Embodiment 2, in which the ferroelectric film constituting the capacitor insulating film 114 contains an element absorbing hydrogen, hydrogen entering the capacitor insulating film 114 is absorbed by the hydrogen-absorbing element and thus does not act to reduce the ferroelectric film. In this way, degradation of the polarization property of the capacitor insulating film 114 due to hydrogen is prevented.

Also, in Embodiment 2, in which the capacitor is covered with the first hydrogen barrier film 112 and the second hydrogen barrier film 116, during heat treatment in a hydrogen atmosphere, most of the hydrogen in the atmosphere is blocked from entering the capacitor by the first and second hydrogen barrier films 112 and 116. In addition, if hydrogen enters the capacitor insulating film through grain boundaries generated at poorly coated positions in the first and second hydrogen barrier films 112 and 116 or through the joint interface between the first and second hydrogen barrier films 112 and 116, such hydrogen is absorbed by the hydrogen-absorbing element. Thus, degradation of the polarization property of the capacitor insulating film due to hydrogen can be prevented more effectively.

The hydrogen-absorbing element is preferably contained in the capacitor insulating film 114 in the state of being bonded with oxygen, that is, in the state of an oxide. By being in this state, the hydrogen-absorbing element is allowed to exist in the capacitor insulating film 114 stably. In addition, hydrogen entering the capacitor insulating film 114 is consumed to dissociate oxygen bonded with the hydrogen-absorbing element. Therefore, degradation of the polarization property of the capacitor insulating film 114 due to hydrogen can be further prevented.

In Embodiment 2, the capacitor had a structure that the top electrode 115 serves as the electrode defining the capacitance, that is, the top electrode 115 is smaller than the bottom electrode 113. Alternatively, a structure that the bottom electrode 113 serves as the electrode defining the capacitance may be adopted.

In Embodiment 2, the capacitor was completely covered with the first and second hydrogen barrier layers 112 and 116. Alternatively, the capacitor may be partly covered.
(Embodiment 3)

Hereinafter, a method for fabricating a capacitor of Embodiment 3 of the present invention will be described with reference to FIGS. 4A to 4D and 5A to 5C.

Figure 4A:
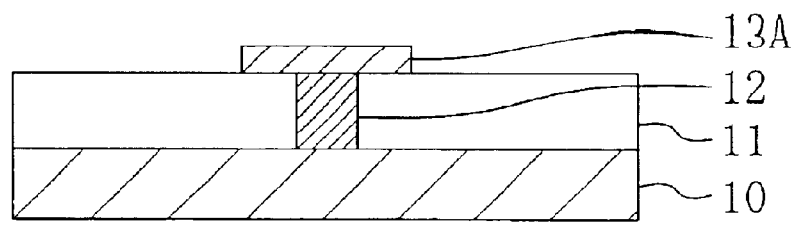
FIGS. 4A to 4D are views showing steps of a method for fabricating a capacitor of Embodiment 3 of the present invention.

First, referring to FIG. 4A, an interlayer insulating film 11 composed of a BPSG film, for example, is formed on a semiconductor substrate 10 on which a memory cell transistor (of which illustration is omitted) is formed. Thereafter, a contact plug 12 composed of a tungsten film or a polysilicon film is formed through the interlayer insulating film 11. The bottom end of the contact plug 12 is connected with the memory cell transistor. A first conductive film composed of a Pt film for promoting crystal growth of a ferroelectric film is then deposited on the interlayer insulating film 11 via an oxygen barrier layer of an IrO/Ir/TiAlN laminated structure. The first conductive film and the oxygen barrier layer are then patterned to form a bottom electrode 13A connected with the top end of the contact plug 12.

Figure 4B:
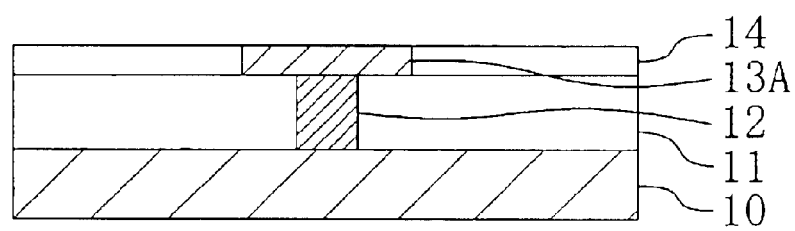

Referring to FIG. 4B, an insulating film 14 composed of an ozone TEOS film, for example, is deposited over the entire surfaces of the bottom electrode 13A and the interlayer insulating film 11. The insulating film 14 is then subjected to CMP, so that the surface of the bottom electrode 13A is exposed while the portion of the insulating film 14 surrounding the bottom electrode 13A is left behind. In the illustrated example, the bottom electrode 13A is embedded in the insulating film 14. Alternatively, the bottom electrode 13A may be formed on the insulating film 14.

Figure 4C:
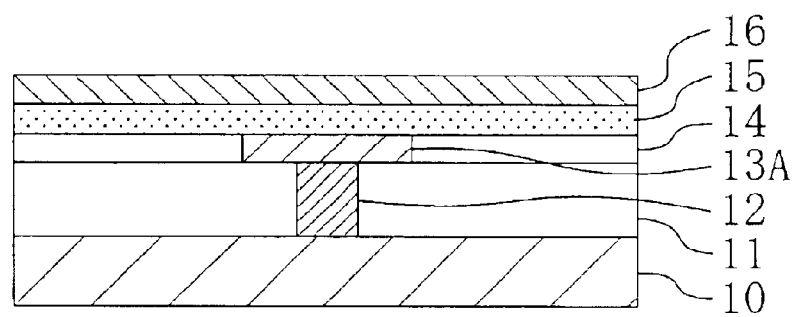

Referring to FIG. 4C, a ferroelectric solution containing a hydrogen-absorbing element composed of at least one selected from the group consisting of Ti, Sc, V, Zr, Nb and La is applied to the entire surfaces of the bottom electrode 13A and the insulating film 14 by spin coating. Wafer baking is then performed at about a temperature at which the solvent is evaporated (150 to 300° C.), to thereby form a ferroelectric film 15 containing a hydrogen-absorbing element. The ferroelectric film 15 is then subjected to provisional sintering by performing RTP for formation of seeds serving as base points for crystal growth. The temperature in RTP, which varies with the kind of the ferroelectric material, is about 650° C. when the ferroelectric film 15 is made of SBT. Thereafter, a second conductive film 16 made of platinum is deposited on the ferroelectric film 15.

Figure 4D:
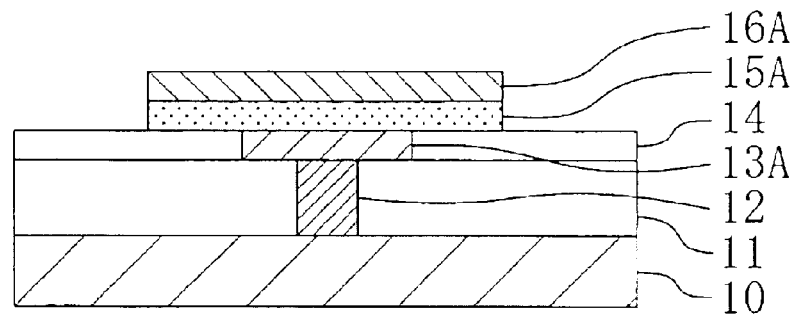

Referring to FIG. 4D, the second conductive film 16 and the ferroelectric film 15 are patterned to form a top electrode 16A composed of the second conductive film 16 and a capacitor insulating film 15A composed of the ferroelectric film 15.

Figure 5A:
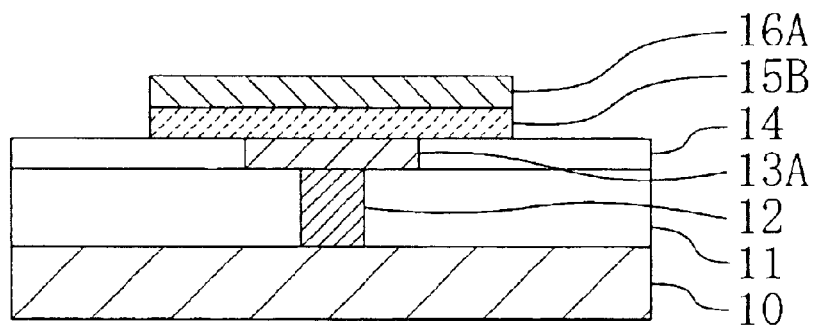
FIGS. 5A to 5C are views showing steps of the method for fabricating a capacitor of Embodiment 3 of the present invention.

The capacitor insulating film 15A is then subjected to heat treatment at high temperature in an oxygen atmosphere, to crystallize the ferroelectric film constituting the capacitor insulating film 15A and place the hydrogen-absorbing element in grain boundaries, inter-lattice positions or holes of the ferroelectric film, to thereby obtain a crystallized capacitor insulating film 15B as shown in FIG. 5A. The temperature for the high-temperature heat treatment is in the range of about 650° C. to about 800° C. when the ferroelectric film is made of SBT. This heat treatment is performed for the capacitor insulating film 15A in the oxygen atmosphere. Therefore, the hydrogen-absorbing element is bonded with oxygen to stay in a stable state.

Figure 5B:
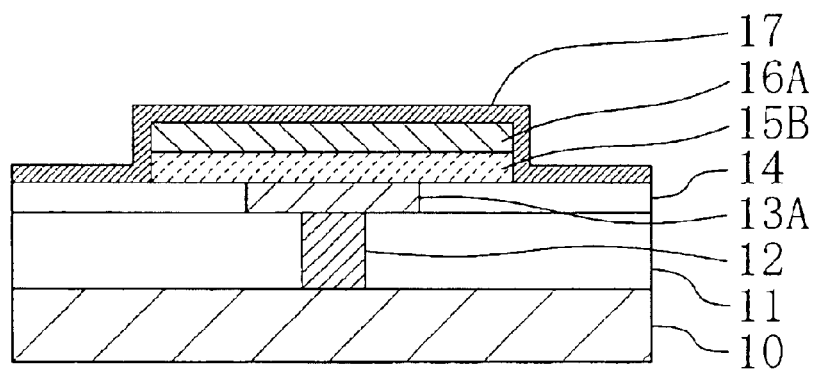
Figure 5C:
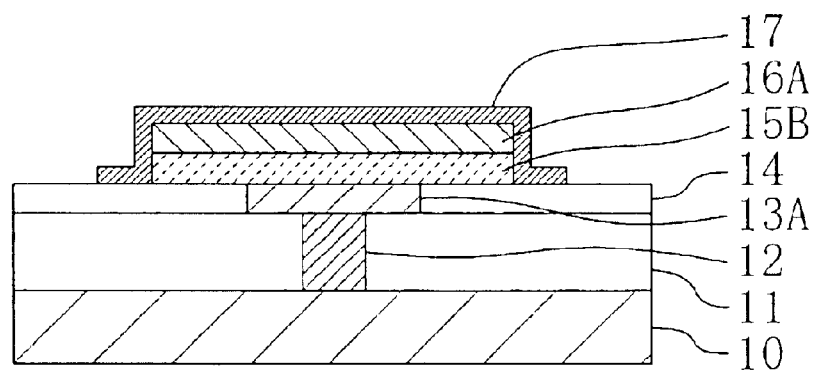

Referring to FIG. 5B, a hydrogen barrier film 17 is deposited over the entire surfaces of the top electrode 16A and the insulating film 14. The hydrogen barrier film 17 is then patterned as shown in FIG. 5C.

In Embodiment 3, the capacitor insulating film 15A is subjected to heat treatment to crystallize the ferroelectric film and place the hydrogen-absorbing element in grain boundaries, inter-lattice positions or holes of the ferroelectric film. Therefore, when the capacitor of the laminated structure composed of the bottom electrode 13A, the capacitor insulating film 15B and the top electrode 16A is subjected to heat treatment in a hydrogen atmosphere, hydrogen entering the capacitor insulating film 15B, if any, is absorbed by the hydrogen-absorbing element. Thus, degradation of the polarization property of the capacitor insulating film 15B due to hydrogen can be prevented.

Also, in Embodiment 3, in which the capacitor is covered with the hydrogen barrier film 17, during heat treatment in a hydrogen atmosphere, most of the hydrogen in the atmosphere is blocked from entering the capacitor by the hydrogen barrier film 17. In addition, if hydrogen enters the capacitor insulating film 15B through grain boundaries generated at poorly coated positions in the hydrogen barrier films 17 or through the joint interface between the hydrogen barrier film 17 and the insulating film 14, such hydrogen is absorbed by the hydrogen-absorbing element. Therefore, degradation of the polarization property of the capacitor insulating film 15B due to hydrogen can be prevented more effectively.

In Embodiment 3, high-temperature beat treatment was performed for the capacitor insulating film 15A composed of the patterned ferroelectric film. Alternatively, high-temperature heat treatment may be performed for the ferroelectric film 15 before being patterned (state shown in FIG. 4C), and in this case, it may be performed before or after the deposition of the second conductive film 16.

The capacitor obtained in Embodiment 3 had a structure that the bottom electrode 13A serves as the electrode defining the capacitance. Alternatively, a structure that the top electrode 16A serves as the electrode defining the capacitance may be adopted.

(Embodiment 4)

Hereinafter, a method for fabricating a capacitor of Embodiment 4 of the present invention will be described with reference to FIGS. 6A to 6D and 7A to 7C.

Figure 6A:
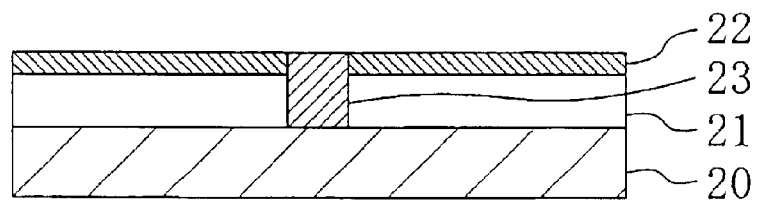
FIGS. 6A to 6D are views showing steps of a method for fabricating a capacitor of Embodiment 4 of the present invention.

First, referring to FIG. 6A, an interlayer insulating film 21 composed of a BPSG film, for example, is formed on a semiconductor substrate 20 on which a memory cell transistor (of which illustration is omitted) is formed. Thereafter, a first hydrogen barrier film 22 composed of a SiN film, a SiON film, a TiAlO film or an $Al_2O_3$ film is deposited on the interlayer insulating film 21. A contact plug 23 composed of a tungsten film or a polysilicon film is then formed through the first hydrogen barrier film 22 and the interlayer insulating film 21. The bottom end of the contact plug 23 is connected with the memory cell transistor.

Figure 6B:
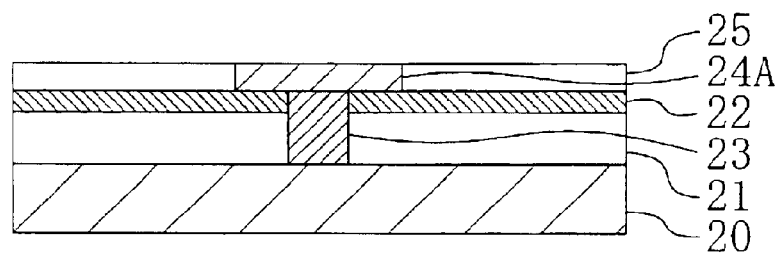

Referring to FIG. 6B, a first conductive film composed of a Pt film for promoting crystal growth of a ferroelectric film is deposited on the first hydrogen barrier film 22 via an oxygen barrier layer of an IrO/Ir/TiAlN laminated structure. The first conductive film and the oxygen barrier layer are then patterned to form a bottom electrode 24A connected with the top end of the contact plug 23. Thereafter, an insulating film 25 composed of an ozone TEOS film, for example, is deposited over the entire surfaces of the bottom electrode 24A and the first hydrogen barrier film 22. The deposited insulating film 25 is then subjected to CMP, so that the surface of the bottom electrode 24A is exposed while the portion of the insulating film 25 surrounding the bottom electrode 24A is left behind. In the illustrated example, the bottom electrode 24A is embedded in the insulating film 25. Alternatively, the bottom electrode 24A may be formed on the insulating film 25.

Figure 6C:
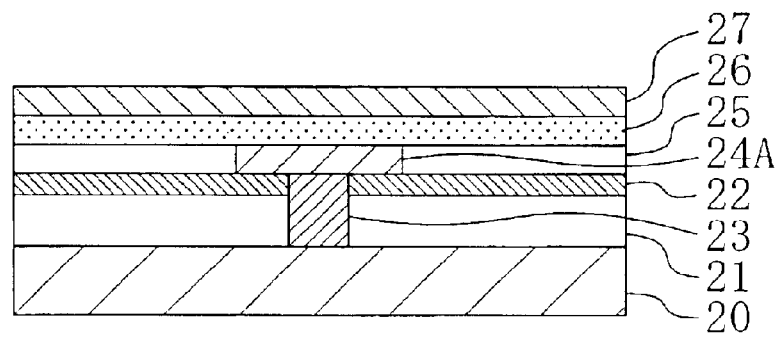

Referring to FIG. 6C, a ferroelectric solution containing a hydrogen-absorbing element composed of at least one selected from the group consisting of Ti, Sc, V, Zr, Nb and La is applied to the entire surfaces of the bottom electrode 24A and the insulating film 25 by spin coating. Wafer baking is then performed at about a temperature at which the solvent is evaporated (150 to 300° C.), to thereby form a ferroelectric film 26 containing a hydrogen-absorbing element. The ferroelectric film 26 is then subjected to provisional sintering by performing RTP for formation of seeds serving as base points for crystal growth. The temperature in RTP, which varies with the kind of the ferroelectric material, is about 650° C. when the ferroelectric film 26 is made of SBT. Thereafter, a second conductive film 27 made of platinum is deposited on the ferroelectric film 26.

Figure 6D:
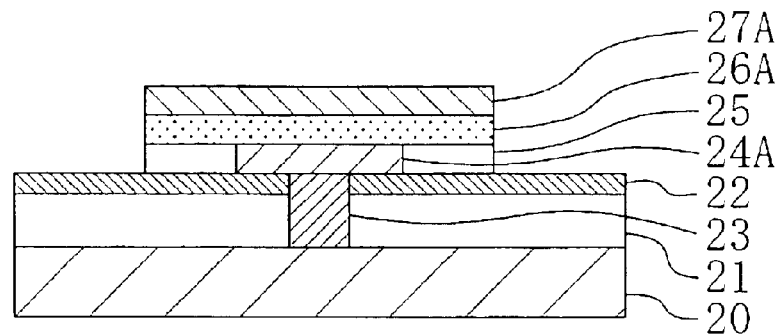

Referring to FIG. 6D, the second conductive film 27 and the ferroelectric film 26 are patterned to form a top electrode 27A composed of the second conductive film 27 and a capacitor insulating film 26A composed of the ferroelectric film 26.

Figure 7A:
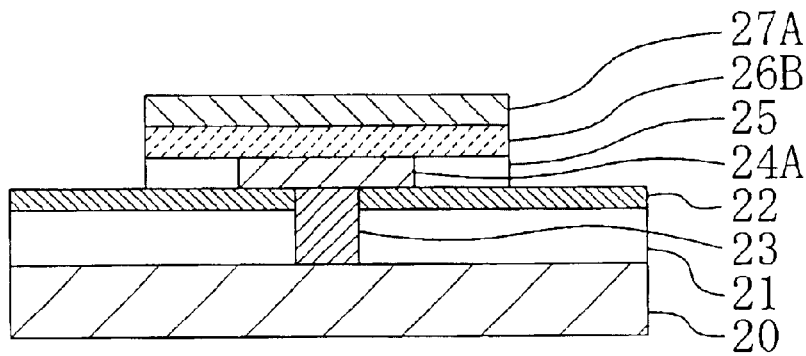
FIGS. 7A to 7C are views showing steps of the method for fabricating a capacitor of Embodiment 4 of the present invention.

The capacitor insulating film 26A is then subjected to heat treatment at high temperature in an oxygen atmosphere, to crystallize the ferroelectric film constituting the capacitor insulating film 26A and place the hydrogen-absorbing element in grain boundaries, inter-lattice positions or holes of the ferroelectric film, to thereby obtain a crystallized capacitor insulating film 26B as shown in FIG. 7A. The temperature for the high-temperature heat treatment is in the range of about 650° C. to about 800° C. when the ferroelectric film is made of SBT. This heat treatment is performed for the capacitor insulating film 26A in the oxygen atmosphere. Therefore, the hydrogen-absorbing element is bonded with oxygen to stay in a stable state.

Figure 7B:
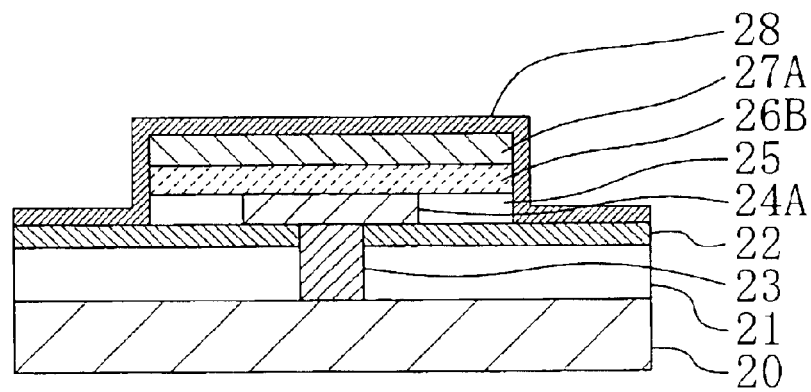
Figure 7C:
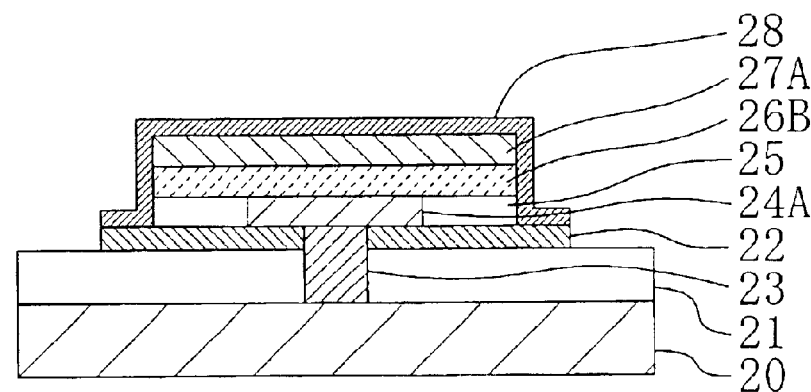

Referring to FIG. 7B, a second hydrogen barrier film 28 is deposited over the entire surfaces of the top electrode 27A and the first hydrogen barrier film 22. The second hydrogen barrier film 28 is then patterned as shown in FIG. 8C.

In Embodiment 4, the capacitor insulating film 26A is subjected to heat treatment to crystallize the ferroelectric film and place the hydrogen-absorbing element in grain boundaries, inter-lattice positions or holes of the ferroelectric film. Therefore, when the capacitor of the laminated structure composed of the bottom electrode 24A, the capacitor insulating film 26B and the top electrode 27A is subjected to heat treatment in a hydrogen atmosphere, hydrogen entering the capacitor insulating film 26B, if any, is absorbed by the hydrogen-absorbing element. Thus, degradation of the polarization property of the capacitor insulating film 26B due to hydrogen can be prevented.

Also, in Embodiment 4, in which the capacitor is covered with the first hydrogen barrier film 22 and the second hydrogen barrier film 28, during heat treatment in a hydrogen atmosphere, most of the hydrogen in the atmosphere is blocked from entering the capacitor by the first and second hydrogen barrier films 22 and 28. In addition, if hydrogen enters the capacitor insulating film 26B through grain boundaries generated at poorly coated positions in the first and second hydrogen barrier films 22 and 28 or through the joint interface between the first and second hydrogen barrier films 22 and 28, such hydrogen is absorbed by the hydrogen-absorbing element. Therefore, degradation of the polarization property of the capacitor insulating film 26B due to hydrogen can be prevented more effectively.

In Embodiment 4, high-temperature heat treatment was performed for the capacitor insulating film 26A composed of the patterned ferroelectric film. Alternatively, high-temperature heat treatment may be performed for the ferroelectric film 26 before being patterned (state shown in FIG. 6C), and in this case, it may be performed before or after the deposition of the second conductive film 27.

The capacitor obtained in Embodiment 4 has a structure that the bottom electrode 24A serves as the electrode defining the capacitance. Alternatively, a structure that the top electrode 27A serves as the electrode defining the capacitance may be adopted.

(Embodiment 5)

Hereinafter, a method for fabricating a capacitor of Embodiment 5 of the present invention will be described with reference to FIGS. 8A to 8C and 9A to 9C.

Figure 8A:
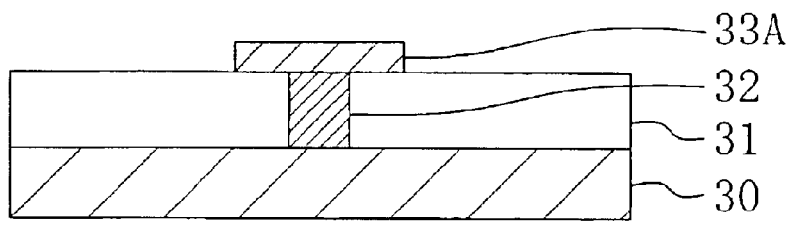
FIGS. 8A to 8C are views showing steps of a method for fabricating a capacitor of Embodiment 5 of the present invention.

First, referring to FIG. 8A, an interlayer insulating film 31 composed of a BPSG film, for example, is formed on a semiconductor substrate 30 on which a memory cell transistor (of which illustration is omitted) is formed. Thereafter, a contact plug 32 composed of a tungsten film or a polysilicon film is formed through the interlayer insulating film 31. The bottom end of the contact plug 32 is connected with the memory cell transistor. A first conductive film composed of a Pt film for promoting crystal growth of a ferroelectric film is then deposited on the interlayer insulating film 31 via an oxygen barrier layer of an IrO/Ir/TiAlN laminated structure. The first conductive film and the oxygen barrier layer are then patterned to form a bottom electrode 33A connected with the top end of the contact plug 32.

Figure 8B:
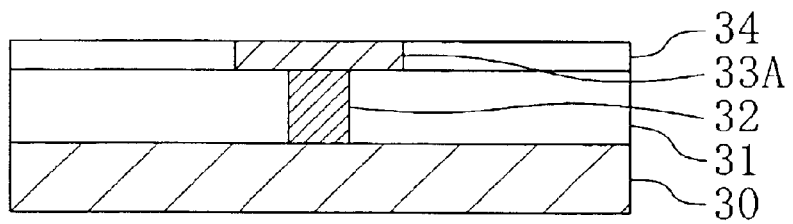
Figure 8C:
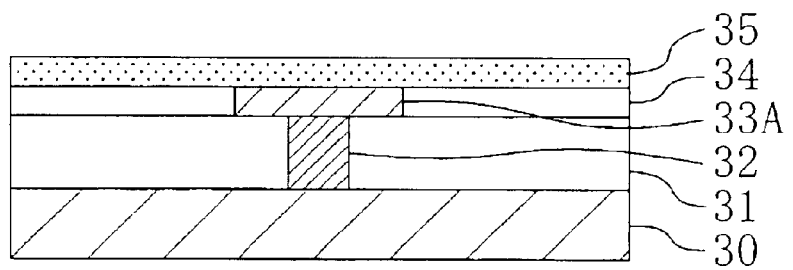

Referring to FIG. 8B, an insulating film 34 composed of an ozone TEOS film, for example, is deposited over the entire surfaces of the bottom electrode 33A and the interlayer insulating film 31. The deposited insulating film 34 is then subjected to CMP, so that the surface of the bottom electrode 33A is exposed while the portion of the insulating film 34 surrounding the bottom electrode 33A is left behind. In the illustrated example, the bottom electrode 33A is embedded in the insulating film 34. Alternatively, the bottom electrode 33A may be formed on the insulating film 34.

Referring to FIG. 8C, a ferroelectric solution containing a hydrogen-absorbing element composed of at least one selected from the group consisting of Ti, Sc, V, Zr, Nb and La is applied to the entire surfaces of the bottom electrode 33A and the insulating film 34 by spin coating. Wafer baking is then performed at about a temperature at which the solvent is evaporated (150 to 300° C.), to thereby form a ferroelectric film 35 containing a hydrogen-absorbing element. The ferroelectric film 35 is then subjected to provisional sintering by performing RTP for formation of seeds serving as base points for crystal growth. The temperature in RTP, which varies with the kind of the ferroelectric material, is about 650° C. when the ferroelectric film 35 is made of SBT.

Figure 9A:
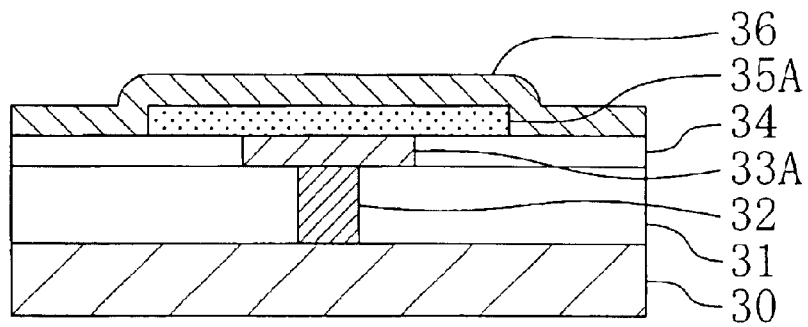
FIGS. 9A to 9C are views showing steps of the method for fabricating a capacitor of Embodiment 5 of the present invention.
Figure 9B:
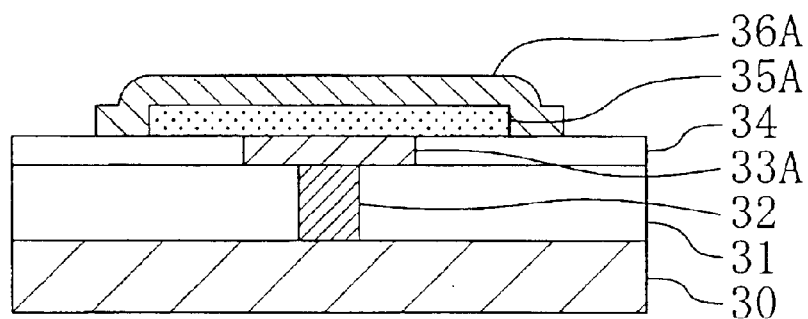
Figure 9C:
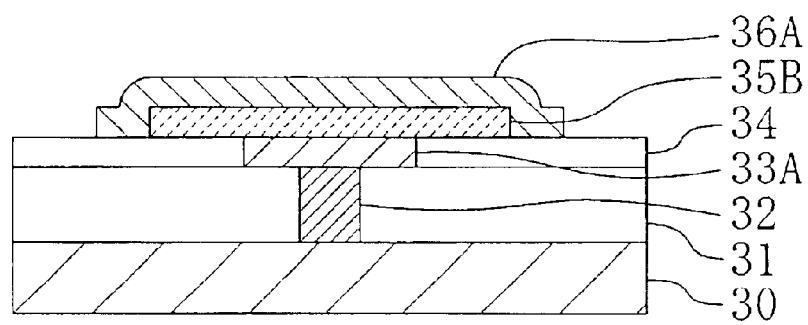

Referring to FIG. 9A, the ferroelectric film 35 is patterned to form a capacitor insulating film 35A, and then a second conductive film 36 made of platinum is deposited over the capacitor insulating film 35A. Thereafter, as shown in FIG. 9B, the second conductive film 36 is patterned to form a top electrode 36A.

The capacitor insulating film 35A is then subjected to heat treatment at high temperature in an oxygen atmosphere, to crystallize the ferroelectric film constituting the capacitor insulating film 35A and place the hydrogen-absorbing element in grain boundaries, inter-lattice positions or holes of the ferroelectric film, to thereby obtain a crystallized capacitor insulating film 35B as shown in FIG. 9A. The temperature for the high-temperature heat treatment is in the range of about 650° C. to about 800° C. when the ferroelectric film is made of SBT. This heat treatment is performed for the capacitor insulating film 35A in the oxygen atmosphere. Therefore, the hydrogen-absorbing element is bonded with oxygen to stay in a stable state.

In Embodiment 5, the capacitor insulating film 35A is subjected to heat treatment to crystallize the ferroelectric film and place the hydrogen-absorbing element in grain boundaries, inter-lattice positions or holes of the ferroelectric film. Therefore, when the capacitor of the laminated structure composed of the bottom electrode 33A, the capacitor insulating film 35B and the top electrode 36A is subjected to heat treatment in a hydrogen atmosphere, hydrogen entering the capacitor insulating film 35B, if any, is absorbed by the hydrogen-absorbing element. Thus, degradation of the polarization property of the capacitor insulating film 35B due to hydrogen can be prevented.

In Embodiment 5, high-temperature heat treatment was performed for the capacitor insulating film 35A after the patterning of the second conductive film 36 for formation of the top electrode 36A. Alternatively, the high-temperature heat treatment may be performed for the capacitor insulating film 35A before the patterning of the second conductive film 36 (state shown in FIG. 9A), may be performed for the capacitor insulating film 35A before the deposition of the second conductive film 36, or may be performed for the ferroelectric film 35 before being patterned (state shown in FIG. 8C).

The capacitor obtained in Embodiment 5 had a structure that the bottom electrode 33A serves as the electrode defining the capacitance. Alternatively, a structure that the top electrode 36A serves as the electrode defining the capacitance may be adopted.

(Embodiment 6)

Hereinafter, a method for fabricating a capacitor of Embodiment 6 of the present invention will be described with reference to FIGS. 10A to 10E.

Figure 10A:
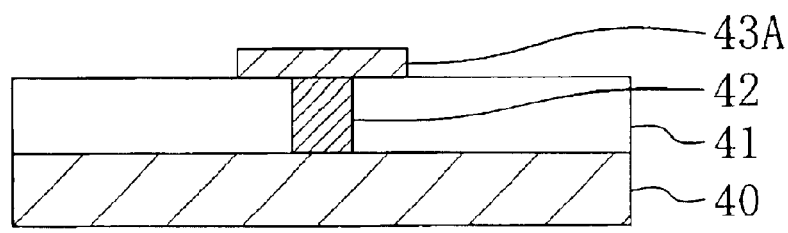
FIGS. 10A to 10E are views showing steps of a method for fabricating a capacitor of Embodiment 6 of the present invention.

First, referring to FIG. 10A, an interlayer insulating film 41 composed of a BPSG film, for example, is formed on a semiconductor substrate 40 on which a memory cell transistor (of which illustration is omitted) is formed. Thereafter, a contact plug 42 composed of a tungsten film or a polysilicon film is formed through the interlayer insulating film 41. The bottom end of the contact plug 42 is connected with the memory cell transistor. A first conductive film composed of a Pt film for promoting crystal growth of a ferroelectric film is then deposited on the interlayer insulating film 41 via an oxygen barrier layer of an IrO/Ir/TiAlN laminated structure. The first conductive film and the oxygen barrier layer are then patterned to form a bottom electrode 43A connected with the top end of the contact plug 42.

Figure 10B:
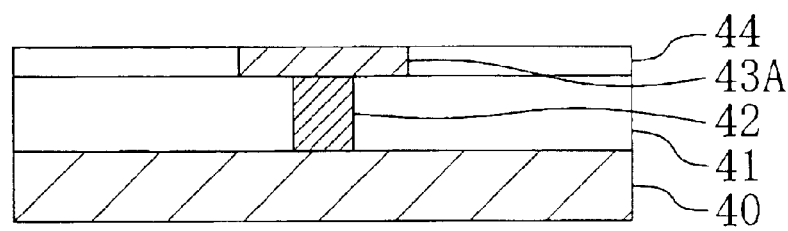

Referring to FIG. 10B, an insulating film 44 composed of an ozone TEOS film, for example, is deposited over the entire surfaces of the bottom electrode 43A and the interlayer insulating film 41. The deposited insulating film 44 is then subjected to CMP, so that the surface of the bottom electrode 43A is exposed while the portion of the insulating film 44 surrounding the bottom electrode 43A is left behind. In the illustrated example, the bottom electrode 43A is embedded in the insulating film 44. Alternatively, the bottom electrode 43A may be formed on the insulating film 44.

Figure 10C:
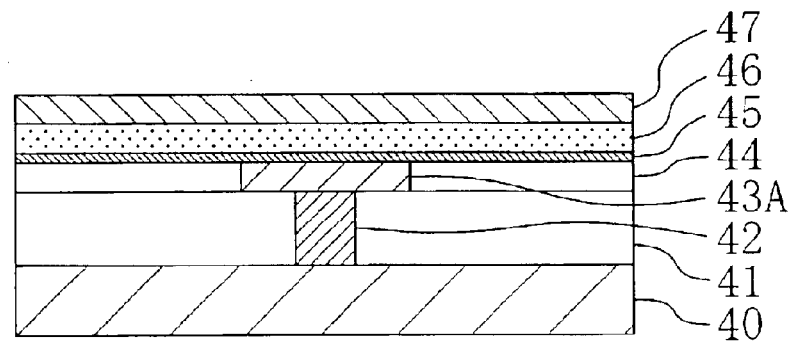

Referring to FIG. 10C, a solution containing a hydrogen-absorbing element composed of at least one selected from the group consisting of Ti, Sc, V, Zr, Nb and La is applied to the entire surfaces of the bottom electrode 43A and the insulating film 44 by spin coating. Wafer baking is then performed at about a temperature at which the solvent is evaporated (150 to 300° C.), to thereby form a hydrogen-absorbing element containing film 45. The hydrogen-absorbing element containing film 45 may otherwise be formed by sputtering using a sputtering target containing a hydrogen-absorbing element, or may be formed by CVD using a process gas containing a hydrogen-absorbing element. The thickness of the hydrogen-absorbing element containing film 45 is preferably as small as possible to prevent reduction of the voltage applied to the capacitor. Specifically, it may be 5 nm or less. Thereafter, a ferroelectric solution is applied to the hydrogen-absorbing element containing film 45 by spin coating, and wafer baking is performed at about a temperature at which the solvent is evaporated (150 to 300° C.), to thereby form a ferroelectric film 46. The ferroelectric film 46 is then subjected to provisional sintering by performing RTP for formation of seeds serving as base points for crystal growth. The temperature in RTP, which varies with the kind of the ferroelectric material, is about 650° C. when the ferroelectric film 46 is made of SBT. Subsequently, a second conductive film 47 made of platinum is deposited on the ferroelectric film 46.

Figure 10D:
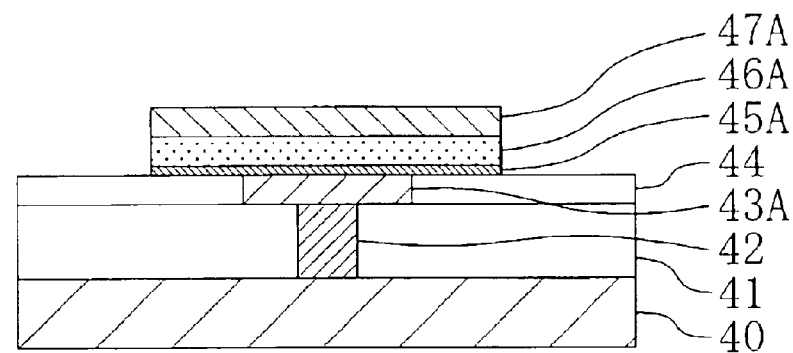

Referring to FIG. 10D, the second conductive film 47, the ferroelectric film 46 and the hydrogen-absorbing element containing film 45 are patterned to form a top electrode 47A composed of the second conductive film 47, a capacitor insulating film 46A composed of the ferroelectric film 46 and a patterned hydrogen-absorbing element containing film 45A.

Figure 10E:
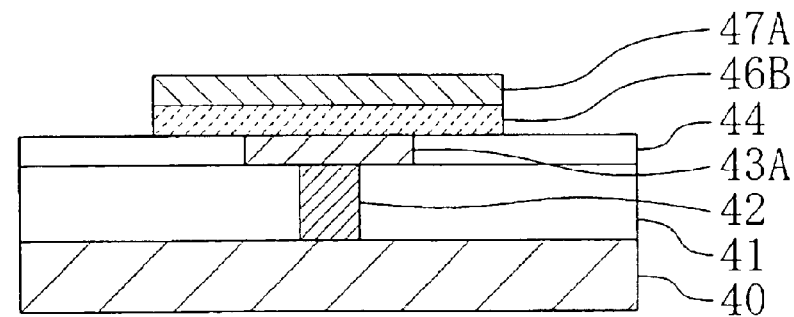

The capacitor insulating film 46A is then subjected to heat treatment at high temperature in an oxygen atmosphere, to crystallize the ferroelectric film constituting the capacitor insulating film 46A and place the hydrogen-absorbing element contained in the hydrogen-absorbing element containing film 45A in grain boundaries, inter-lattice positions or holes of the ferroelectric film, to obtain a crystallized capacitor insulating film 46B as shown in FIG. 10E. The temperature for the high-temperature heat treatment is in the range of about 650° C. to about 800° C. when the ferroelectric film is made of SBT. This heat treatment is performed for the capacitor insulating film 46A in the oxygen atmosphere. Therefore, the hydrogen-absorbing element is bonded with oxygen to stay in a stable state.

In Embodiment 6, the capacitor insulating film 46A is subjected to heat treatment to crystallize the ferroelectric film and place the hydrogen-absorbing element contained in the hydrogen-absorbing element containing film 45 in grain boundaries, inter-lattice positions or holes of the ferroelectric film. Therefore, when the capacitor of the laminated structure composed of the bottom electrode 43A, the capacitor insulating film 46B and the top electrode 47A is subjected to heat treatment in a hydrogen atmosphere, hydrogen entering the capacitor insulating film 46B, if any, is absorbed by the hydrogen-absorbing element. In this way, degradation of the polarization property of the capacitor insulating film 46B due to hydrogen can be prevented.

In Embodiment 6, high-temperature heat treatment was performed for the capacitor insulating film 46A of the patterned ferroelectric film. Alternatively, the high-temperature heat treatment may be performed for the ferroelectric film 46 before being patterned (state shown in FIG. 10C), and in this case, it may be performed before or after the deposition of the second conductive film 47.

The capacitor obtained in Embodiment 6 had a structure that the bottom electrode 43A serves as the electrode defining the capacitance. Alternatively, a structure that the top electrode 46A serves as the electrode defining the capacitance may be adopted.

(Embodiment 7)

Hereinafter, a method for fabricating a capacitor of Embodiment 7 of the present invention will be described with reference to FIGS. 11A to 11C and 12A to 12C.

Figure 12A:
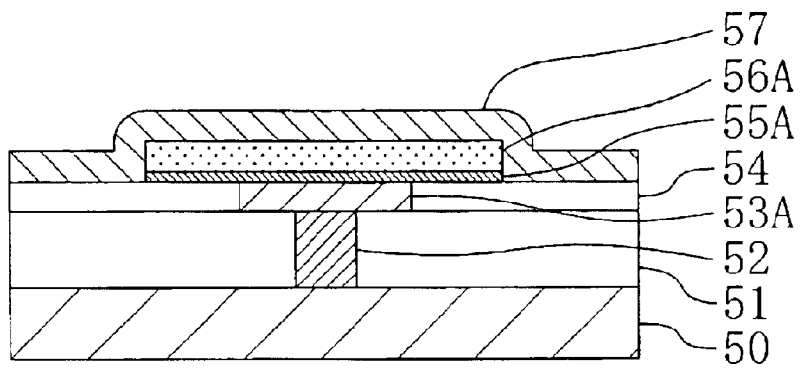
FIGS. 12A to 12C are views showing steps of the method for fabricating a capacitor of Embodiment 7 of the present invention.

First, referring to FIG. 12A, an interlayer insulating film 51 composed of a BPSG film, for example, is formed on a semiconductor substrate 50 on which a memory cell transistor (of which illustration is omitted) is formed. Thereafter, a contact plug 52 composed of a tungsten film or a polysilicon film is formed through the interlayer insulating film 51. The bottom end of the contact plug 52 is connected with the memory cell transistor. A first conductive film composed of a Pt film for promoting crystal growth of a ferroelectric film is then deposited on the interlayer insulating film 51 via an oxygen barrier layer of an IrO/Ir/TiAlN laminated structure. The first conductive film and the oxygen barrier layer are then patterned to form a bottom electrode 53A connected with the top end of the contact plug 52.

Figure 11A:
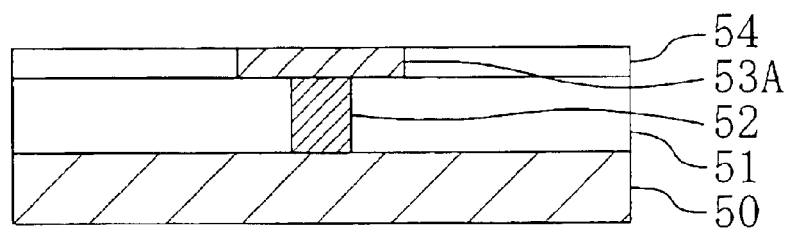
FIGS. 11A to 11C are views showing steps of a method for fabricating a capacitor of Embodiment 7 of the present invention.
Figure 11B:
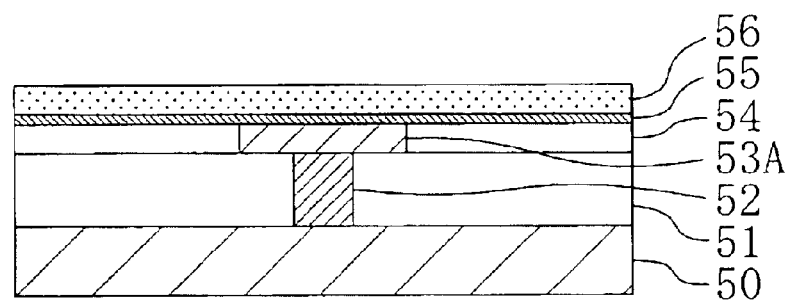

Referring to FIG. 11B, an insulating film 54 composed of an ozone TEOS film, for example, is deposited over the entire surfaces of the bottom electrode 53A and the interlayer insulating film 51. The deposited insulating film 54 is then subjected to CMP, so that the surface of the bottom electrode 53A is exposed while the portion of the insulating film 54 surrounding the bottom electrode 53A is left behind. In the illustrated example, the bottom electrode 53A is embedded in the insulating film 54. Alternatively, the bottom electrode 53A may be formed on the insulating film 54.

Thereafter, a solution containing a hydrogen-absorbing element composed of at least one selected from the group consisting of Ti, Sc, V, Zr, Nb and La is applied to the entire surfaces of the bottom electrode 53A and the insulating film 54 by spin coating. Wafer baking is then performed at about a temperature at which the solvent is evaporated (150 to 300° C.), to thereby form a hydrogen-absorbing element containing film 55. The hydrogen-absorbing element containing film 55 may otherwise be formed by sputtering using a sputtering target containing a hydrogen-absorbing element, or may be formed by CVD using a process gas containing a hydrogen-absorbing element. The thickness of the hydrogen-absorbing element containing film 55 is preferably as small as possible to prevent reduction of the voltage applied to the capacitor. Specifically, it may be 5 nm or less. Thereafter, a ferroelectric solution is applied to the hydrogen-absorbing element containing film 55 by spin coating, and wafer baking is performed at about a temperature at which the solvent is evaporated (150 to 300° C.), to thereby form a ferroelectric film 56. The ferroelectric film 56 is then subjected to provisional sintering by performing RTP for formation of seeds serving as base points for crystal growth. The temperature in RTP, which varies with the kind of the ferroelectric material, is about 650° C. when the ferroelectric film 56 is made of SBT.

Figure 11C:
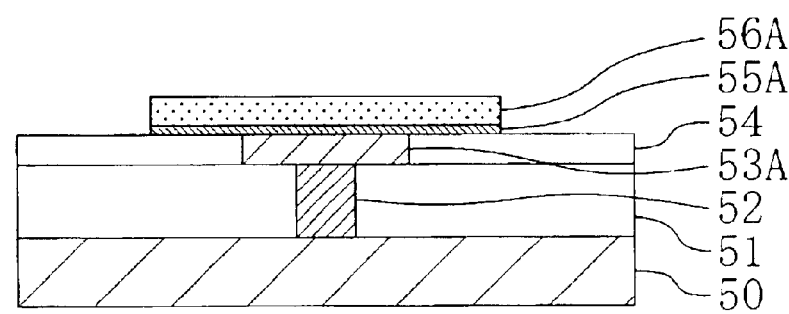

Referring to FIG. 11C, the ferroelectric film 56 and the hydrogen-absorbing eminent containing film 55 are patterned to form a capacitor insulating film 56A composed of the ferroelectric film 56 and a patterned hydrogen-absorbing element containing film 55A.

Figure 12B:
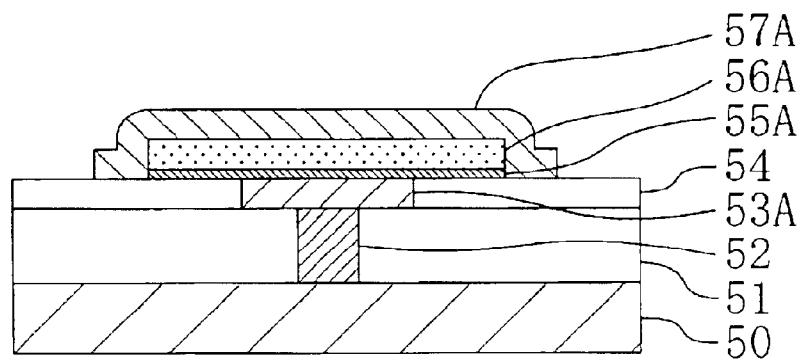

Referring to FIG. 12A, a second conductive film 57 made of platinum is formed over the entire surfaces of the capacitor insulating film 56A and the insulating film 54. The second conductive film 57 is then patterned to form a top electrode 57A as shown in FIG. 12B.

Figure 12C:
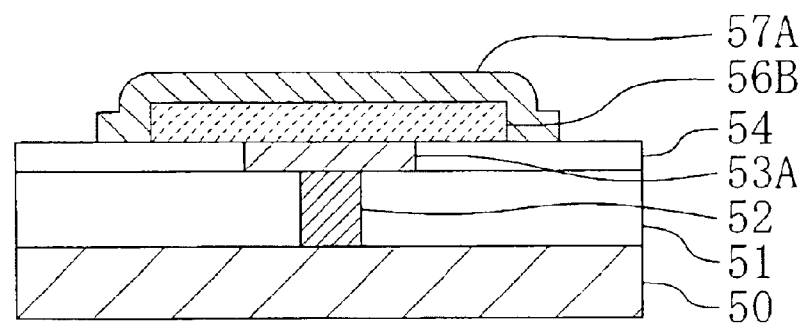

The capacitor insulating film 56A is then subjected to heat treatment at high temperature in an oxygen atmosphere, to crystallize the ferroelectric film constituting the capacitor insulating film 56A and place the hydrogen-absorbing element contained in the patterned hydrogen-absorbing element containing film 55A in grain boundaries, inter-lattice positions or holes of the ferroelectric film, to obtain a crystallized capacitor insulating film 56B as shown in FIG. 12C. The temperature for the high-temperature heat treatment is in the range of about 650° C. to about 800° C. when the ferroelectric film is made of SBT. This heat treatment is performed for the capacitor insulating film 56A in the oxygen atmosphere. Therefore, the hydrogen-absorbing element is bonded with oxygen to stay in a stable state.

In Embodiment 7, the capacitor insulating film 56A is subjected to heat treatment to crystallize the ferroelectric film and place the hydrogen-absorbing element contained in the hydrogen-absorbing element containing film 55 in grain boundaries, inter-lattice positions or holes of the ferroelectric film. Therefore, when the capacitor of the laminated structure composed of the bottom electrode 53A, the capacitor insulating film 56B and the top electrode 57A is subjected to heat treatment in a hydrogen atmosphere, hydrogen entering the capacitor insulating film 56B, if any, is absorbed by the hydrogen-absorbing element. Thus, degradation of the polarization property of the capacitor insulating film 56B due to hydrogen can be prevented.

In Embodiment 7, high-temperature heat treatment was performed for the capacitor insulating film 56A of the patterned ferroelectric film after the patterning of the second conductive film 57 to form the top electrode 57A. Alternatively, the high-temperature heat treatment may be performed for the capacitor insulating film 56A of the patterned ferroelectric film before the patterning of the second conductive film 57 (state shown in FIG. 12A), may be performed for the capacitor insulating film 56A of the patterned ferroelectric film before the deposition of the second conductive film 57 (state shown in FIG. 11C), or may be performed for the ferroelectric film 56 before being patterned (state shown in FIG. 11B).

The capacitor obtained in Embodiment 7 had a structure that the bottom electrode 53A serves as the electrode defining the capacitance. Alternatively, a structure that the top electrode 57A serves as the electrode defining the capacitance may be adopted.

(Embodiment 8)

Hereinafter, a method for fabricating a capacitor of Embodiment 7 of the present invention will be described with reference to FIGS. 13A to 13E.

Figure 13A:
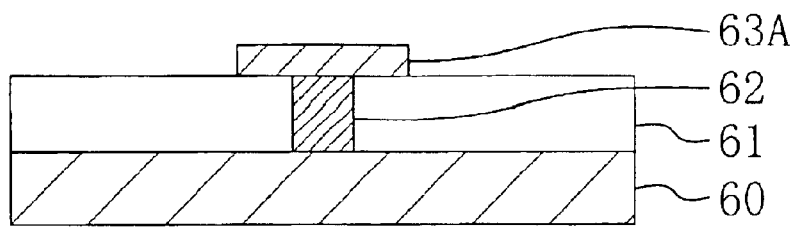
FIGS. 13A to 13E are views showing steps of a method for fabricating a capacitor of Embodiment 8 of the present invention.

First, referring to FIG. 13A, an interlayer insulating film 61 composed of a BPSG film, for example, is formed on a semiconductor substrate 60 on which a memory cell transistor (of which illustration is omitted) is formed. Thereafter, a contact plug 62 composed of a tungsten film or a polysilicon film is formed through the interlayer insulating film 61. The bottom end of the contact plug 62 is connected with the memory cell transistor. A first conductive film composed of a Pt film for promoting crystal growth of a ferroelectric film is then deposited on the interlayer insulating film 61 via an oxygen barrier layer of an IrO/Ir/TiAlN laminated structure. The first conductive film and the oxygen barrier layer are then patterned to form a bottom electrode 63A connected with the top end of the contact plug 62.

Figure 13B:
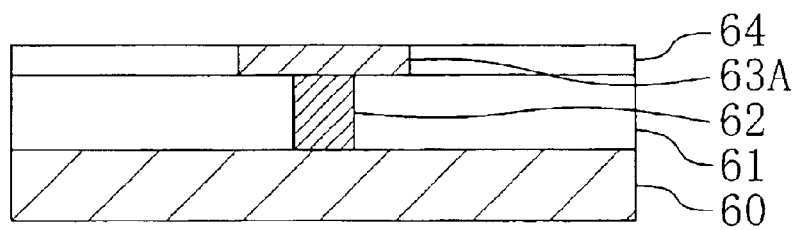

Referring to FIG. 13B, an insulating film 64 composed of an ozone TEOS film, for example, is deposited over the entire surfaces of the bottom electrode 63A and the interlayer insulating film 61. The deposited insulating film 64 is then subjected to CMP, so that the surface of the bottom electrode 63A is exposed while the portion of the insulating film 64 surrounding the bottom electrode 63A is left behind. In the illustrated example, the bottom electrode 63A is embedded in the insulating film 64. Alternatively, the bottom electrode 63A may be formed on the insulating film 64.

Figure 13C:
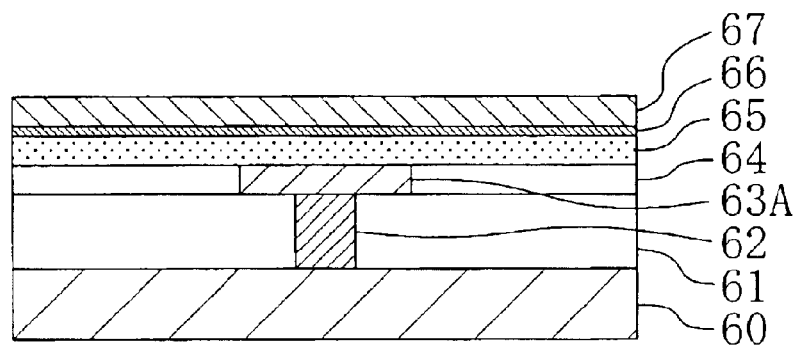

Referring to FIG. 13C, a ferroelectric solution is applied to the surfaces of the bottom electrode 63A and the insulating film 64 by spin coating, and wafer baking is performed at about a temperature at which the solvent is evaporated (150 to 300° C.), to thereby form a ferroelectric film 65. The ferroelectric film 65 is then subjected to provisional sintering by performing RTP for formation of seeds serving as base points for crystal growth. The temperature in RTP, which varies with the kind of the ferroelectric material, is about 650° C. when the ferroelectric film 65 is made of SBT.

Subsequently, a solution containing a hydrogen-absorbing element composed of at least one selected from the group consisting of Ti, Sc, V, Zr, Nb and La is applied to the entire surface of the ferroelectric film 65 by spin coating. Wafer baking is then performed at about a temperature at which the solvent is evaporated (150 to 300° C.), to thereby form a hydrogen-absorbing element containing film 66. The hydrogen-absorbing element containing film 66 may otherwise be formed by sputtering using a sputtering target containing a hydrogen-absorbing element, or may be formed by CVD using a process gas containing a hydrogen-absorbing element. The thickness of the hydrogen-absorbing element containing film 66 is preferably as small as possible to prevent reduction of the voltage applied to the capacitor. Specifically, it may be 5 nm or less. Thereafter, a second conductive film 67 made of platinum is deposited on the hydrogen-absorbing element containing film 66.

Figure 13D:
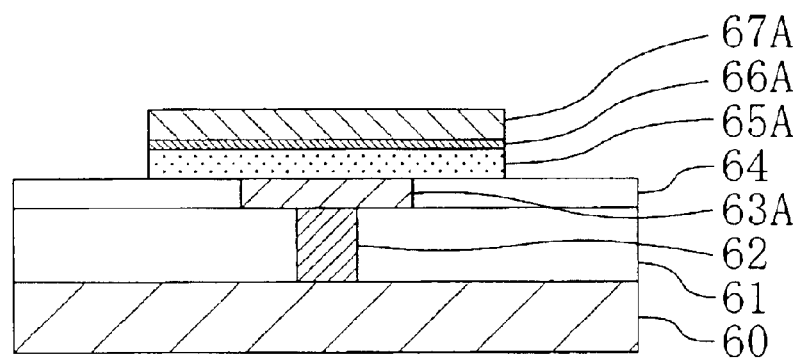

Referring to FIG. 13D, the second conductive film 67, the hydrogen-absorbing element containing film 66 and the ferroelectric film 65 are patterned to form a top electrode 67A composed of the second conductive film 67, a patterned hydrogen-absorbing element containing film 66A and a capacitor insulating film 65A composed of the ferroelectric film 65.

Figure 13E:
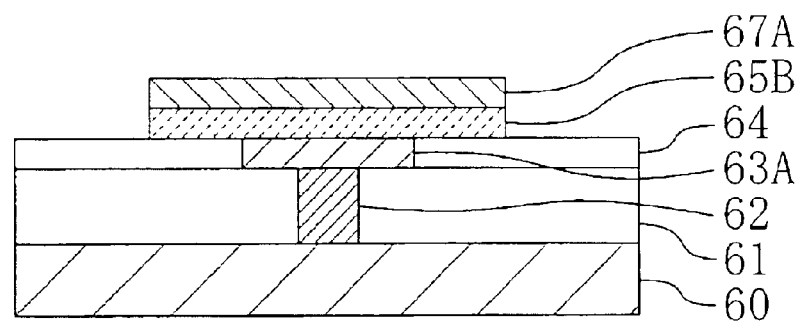

The capacitor insulating film 65A is then subjected to heat treatment at high temperature in an oxygen atmosphere, to crystallize the ferroelectric film constituting the capacitor insulating film 65A and place the hydrogen-absorbing element contained in the hydrogen-absorbing element containing film 66A in grain boundaries, inter-lattice positions or holes of the ferroelectric film, to obtain a crystallized capacitor insulating film 65B as shown in FIG. 13E. The temperature for the high-temperature heat treatment is in the range of about 650° C. to about 800° C. when the ferroelectric film is made of SBT. This heat treatment is performed for the capacitor insulating film 65A in the oxygen atmosphere. Therefore, the hydrogen-absorbing element is bonded with oxygen to stay in a stable state.

In Embodiment 8, the capacitor insulating film 65A is subjected to heat treatment to crystallize the ferroelectric film and place the hydrogen-absorbing element contained in the hydrogen-absorbing element containing film 66A in grain boundaries, inter-lattice positions or holes of the ferroelectric film. Therefore, when the capacitor of the laminated structure composed of the bottom electrode 63A, the capacitor insulating film 65B and the top electrode 67A is subjected to heat treatment in a hydrogen atmosphere, hydrogen entering the capacitor insulating film 65B, if any, is absorbed by the hydrogen-absorbing element. Thus, degradation of the polarization property of the capacitor insulating film 65B due to hydrogen can be prevented.

In Embodiment 8, high-temperature heat treatment was performed for the capacitor insulating film 65A of the patterned ferroelectric film. Alternatively, the high-temperature heat treatment may be performed for the ferroelectric film 65 before being patterned (state shown in FIG. 13C), and in this case, it may be performed before or after the deposition of the second conductive film 67.

The capacitor obtained in Embodiment 8 had a structure that the bottom electrode 63A serves as the electrode defining the capacitance. Alternatively, a structure that the top electrode 67A serves as the electrode defining the capacitance may be adopted.

(Embodiment 9)

Hereinafter, a method for fabricating a capacitor of Embodiment 9 of the present invention will be described with reference to FIGS. 14A to 14C and 15A to 15C.

Figure 14A:
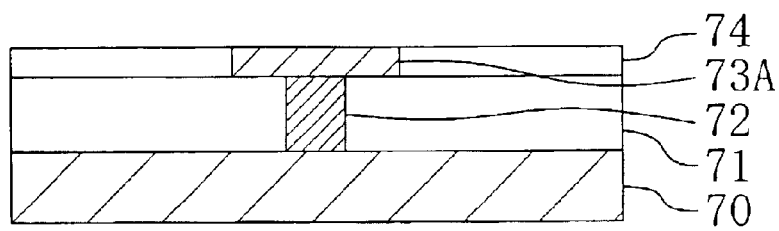
FIGS. 14A to 14C are views showing steps of a method for fabricating a capacitor of Embodiment 9 of the present invention.

First, referring to FIG. 14A, an interlayer insulating film 71 composed of a BPSG film, for example, is formed on a semiconductor substrate 70 on which a memory cell transistor (of which illustration is omitted) is formed. Thereafter, a contact plug 72 composed of a tungsten film or a polysilicon film is formed through the interlayer insulating film 71. The bottom end of the contact plug 72 is connected with the memory cell transistor. A first conductive film composed of a Pt film for promoting crystal growth of a ferroelectric film is then deposited on the interlayer insulating film 71 via an oxygen barrier layer of an IrO/Ir/TiAlN laminated structure. The first conductive film and the oxygen barrier layer are then patterned to form a bottom electrode 73A connected with the top end of the contact plug 72. Thereafter, an insulating film 74 composed of an ozone TEOS film, for example, is deposited over the entire surfaces of the bottom electrode 73A and the interlayer insulating film 71. The deposited insulating film 74 is then subjected to CMP, so that the surface of the bottom electrode 73A is exposed while the portion of the insulating film 74 surrounding the bottom electrode 73A is left behind. In the illustrated example, the bottom electrode 73A is embedded in the insulating film 74. Alternatively, the bottom electrode 73A may be formed on the insulating film 74.

Figure 14B:
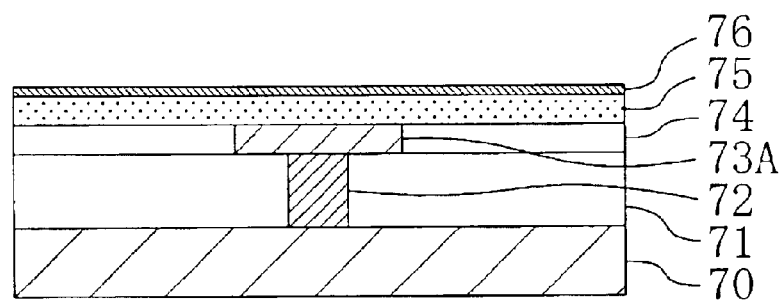

Referring to FIG. 14B, a ferroelectric solution is applied to the surfaces of the bottom electrode 73A and the insulating film 74 by spin coating, and wafer baking is performed at about a temperature at which the solvent is evaporated (150 to 300° C.), to thereby form a ferroelectric film 75. The ferroelectric film 75 is then subjected to provisional sintering by performing RTP for formation of seeds serving as base points for crystal growth. The temperature in RTP, which varies with the kind of the ferroelectric material, is about 650° C. when the ferroelectric film 75 is made of SBT.

Subsequently, a solution containing a hydrogen-absorbing element composed of at least one selected from the group consisting of Ti, Sc, V, Zr, Nb and La is applied to the entire surface of the ferroelectric film 75 by spin coating. Wafer baking is then performed at about a temperature at which the solvent is evaporated (150 to 300° C.), to thereby form a hydrogen-absorbing element containing film 76. The hydrogen-absorbing element containing film 76 may otherwise be formed by sputtering using a sputtering target containing a hydrogen-absorbing element, or may be formed by CVD using a process gas containing a hydrogen-absorbing element. The thickness of the hydrogen-absorbing element containing film 76 is preferably as small as possible to prevent reduction of the voltage applied to the capacitor. Specifically, it may be 5 nm or less.

Figure 14C:
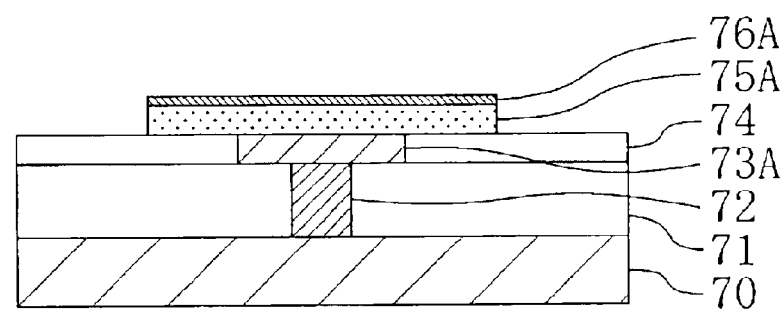

Referring to FIG. 14C, the hydrogen-absorbing element containing film 76 and the ferroelectric film 75 are patterned to form a patterned hydrogen-absorbing element containing film 76A and a capacitor insulating film 75A composed of the ferroelectric film 75.

Figure 15A:
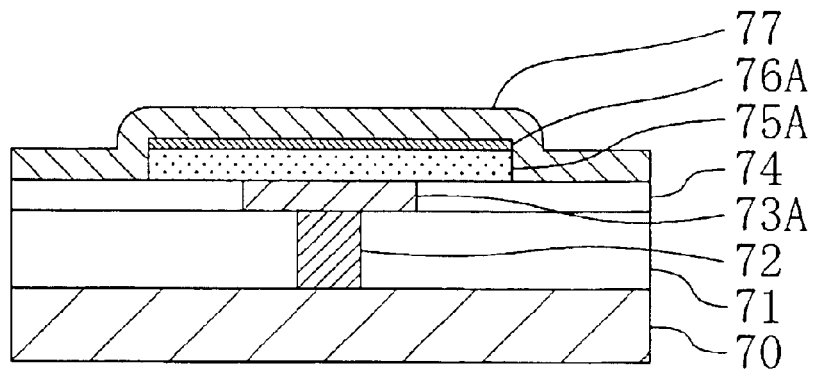
FIGS. 15A to 15C are views showing steps of the method for fabricating a capacitor of Embodiment 9 of the present invention.
Figure 15B:
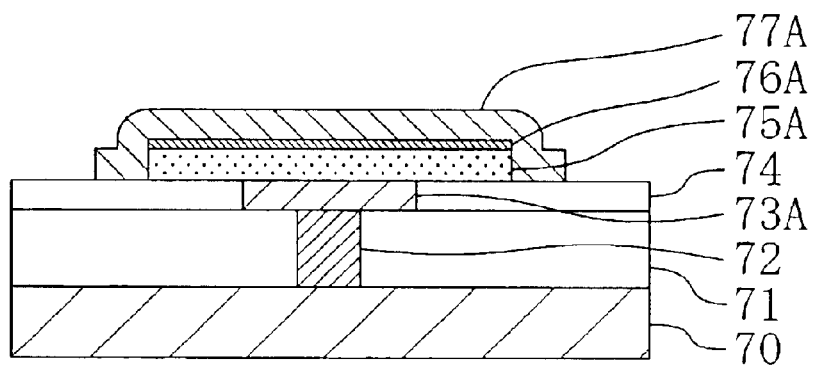

Referring to FIG. 15A, a second conductive film 77 made of platinum is formed over the entire surfaces of the patterned hydrogen-absorbing element containing film 76A and the insulating film 74. The second conductive film 77 is then patterned to form a top electrode 77A as shown in FIG. 15B.

Figure 15C:
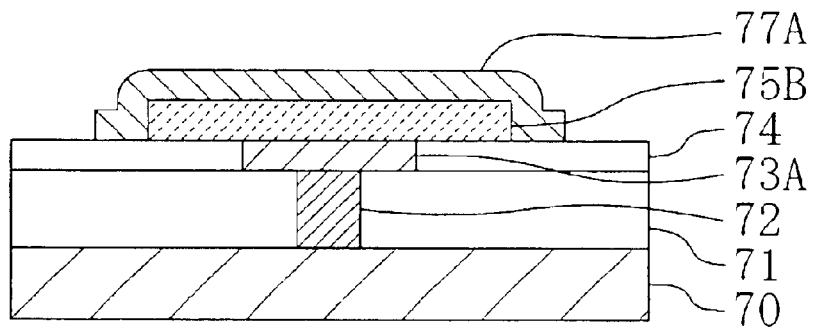

The capacitor insulating film 75A is then subjected to heat treatment at high temperature in an oxygen atmosphere, to crystallize the ferroelectric film constituting the capacitor insulating film 75A and place the hydrogen-absorbing element contained in the hydrogen-absorbing element containing film 76A in grain boundaries, inter-lattice positions or holes of the ferroelectric film, to obtain a crystallized capacitor insulating film 75B as shown in FIG. 15C. The temperature for the high-temperature heat treatment is in the range of about 650° C. to about 800° C. when the ferroelectric film is made of SBT. This heat treatment is performed for the capacitor insulating film 75A in the oxygen atmosphere. Therefore, the hydrogen-absorbing element is bonded with oxygen to stay in a stable state.

In Embodiment 9, the capacitor insulating film 75A is subjected to heat treatment to crystallize the ferroelectric film and place the hydrogen-absorbing element contained in the hydrogen-absorbing element containing film 76A in grain boundaries, inter-lattice positions or holes of the ferroelectric film. Therefore, when the capacitor of the laminated structure composed of the bottom electrode 73A, the capacitor insulating film 75B and the top electrode 77A is subjected to heat treatment in a hydrogen atmosphere, hydrogen entering the capacitor insulating film 75B, if any, is absorbed by the hydrogen-absorbing element. Thus, degradation of the polarization property of the capacitor insulating film 75B due to hydrogen can be prevented.

In Embodiment 9, high-temperature heat treatment was performed for the capacitor insulating film 75A of the patterned ferroelectric film after the patterning of the second conductive film 77 to form the top electrode 77A. Alternatively, the high-temperature heat treatment may be performed for the capacitor insulating film 75A of the patterned ferroelectric film before the patterning of the second conductive film 77 (state shown in FIG. 15A), may be performed for the capacitor insulating film 75A of the patterned ferroelectric film before the deposition of the second conductive film 77 (state shown in FIG. 14C), or may be performed for the ferroelectric film 75 before being patterned (state shown in FIG. 14B).

The capacitor obtained in Embodiment 9 had a structure that the bottom electrode 73A serves as the electrode defining the capacitance. Alternatively, a structure that the top electrode 77A serves as the electrode defining the capacitance may be adopted.

(Embodiment 10)

Hereinafter, a method for fabricating a capacitor of Embodiment 10 of the present invention will be described with reference to FIGS. 16A to 16C and 17A to 17C.

Figure 16A:
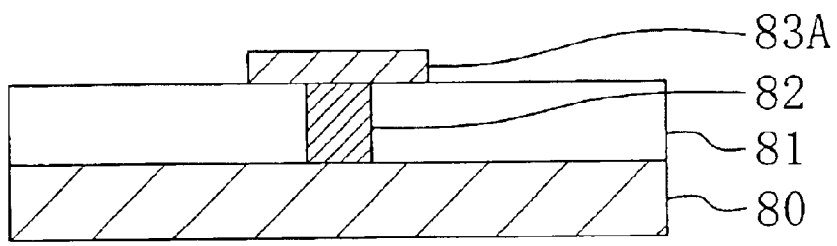
FIGS. 16A to 16C are views showing steps of a method for fabricating a capacitor of Embodiment 10 of the present invention.

First, referring to FIG. 16A, an interlayer insulating film 81 composed of a BPSG film, for example, is formed on a semiconductor substrate 80 on which a memory cell transistor (of which illustration is omitted) is formed. Thereafter, a contact plug 82 composed of a tungsten film or a polysilicon film is formed through the interlayer insulating film 81. The bottom end of the contact plug 82 is connected with the memory cell transistor. A first conductive film formed of a Pt film for promoting crystal growth of a ferroelectric film is then deposited on the interlayer insulating film 81 via an oxygen barrier layer of an IrO/Ir/TiAlN laminated structure. The first conductive film and the oxygen barrier layer are then patterned to form a bottom electrode 83A connected with the top end of the contact plug 82.

Figure 16B:
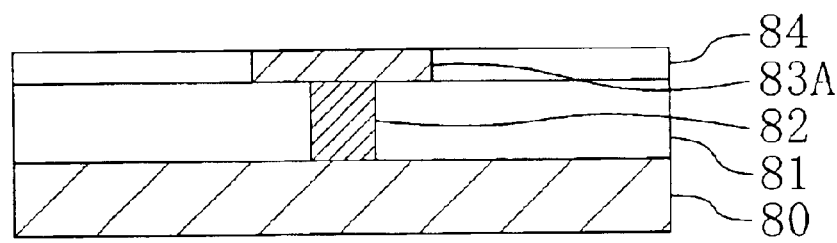

Referring to FIG. 16B, an insulating film 84 composed of an ozone TEOS film, for example, is deposited over the entire surfaces of the bottom electrode 83A and the interlayer insulating film 81. The insulating film 84 is then subjected to CMP, so that the surface of the bottom electrode 83A is exposed while the portion of the insulating film 84 surrounding the bottom electrode 83A is left behind. In the illustrated example, the bottom electrode 83A is embedded in the insulating film 84. Alternatively, the bottom electrode 83A may be formed on the insulating film 84.

Figure 16C:
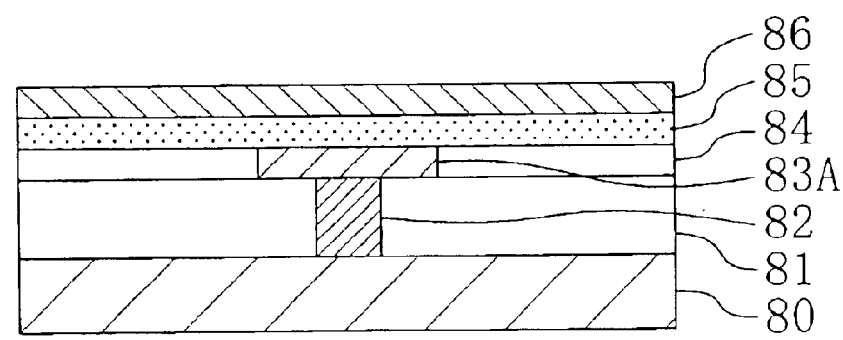

Referring to FIG. 16C, a ferroelectric solution is applied to the surfaces of the bottom electrode 83A and the insulating film 84 by spin coating. Wafer baking is then performed at about a temperature at which the solvent is evaporated (150 to 300° C.), to thereby form a ferroelectric film 85. The ferroelectric film 85 is then subjected to provisional sintering by performing RTP for formation of seeds serving as base points for crystal growth. The temperature in RTP, which varies with the kind of the ferroelectric material, is about 650° C. when the ferroelectric film 85 is made of SBT. Thereafter, a second conductive film 86 made of platinum is deposited on the ferroelectric film 85.

Figure 17A:
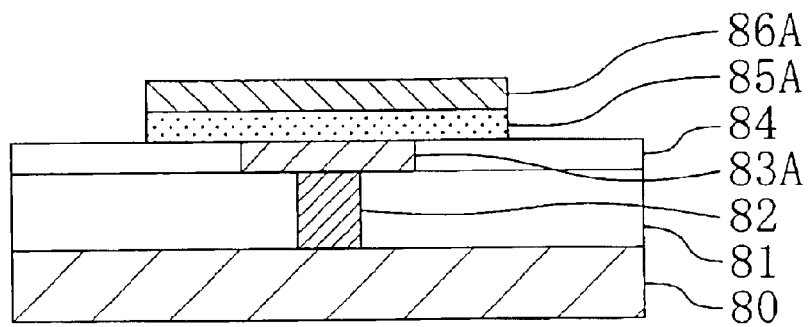
FIGS. 17A to 17C are views showing steps of the method for fabricating a capacitor of Embodiment 10 of the present invention.
Figure 17B:
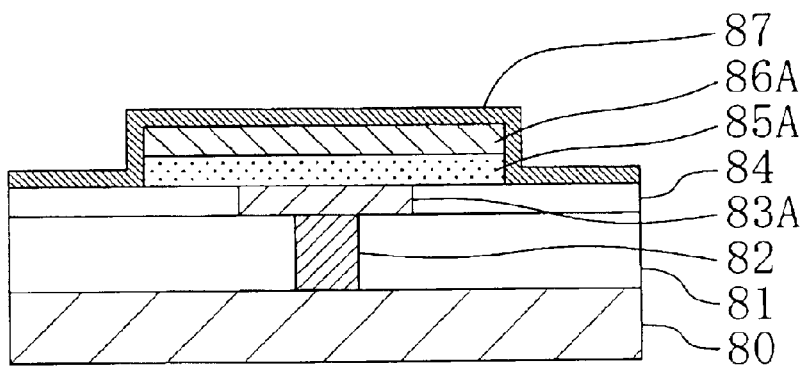

Referring to FIG. 17A, the second conductive film 86 and the ferroelectric film 85 are patterned, to form a top electrode 86A composed of the second conductive film 86 and a capacitor insulating film 85A composed of the ferroelectric film 85.

Thereafter, a solution containing a hydrogen-absorbing element composed of at least one selected from the group consisting of Ti, Sc, V, Zr, Nb and La is applied to the entire surfaces of the top electrode 86A and the insulating film 84 by spin coating. Wafer baking is then performed at about a temperature at which the solvent is evaporated (150 to 300° C.), to thereby form a hydrogen-absorbing element containing film 87. The hydrogen-absorbing element containing film 87 may otherwise be formed by sputtering using a sputtering target containing a hydrogen-absorbing element, or may be formed by CVD using a process gas containing a hydrogen-absorbing element. The thickness of the hydrogen-absorbing element containing film 87 is not specifically limited, unlike in Embodiments 3 to 9.

Figure 17C:
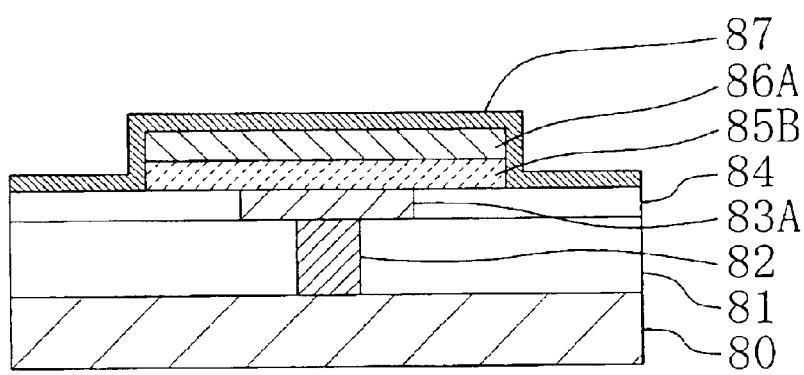
Figure 18:
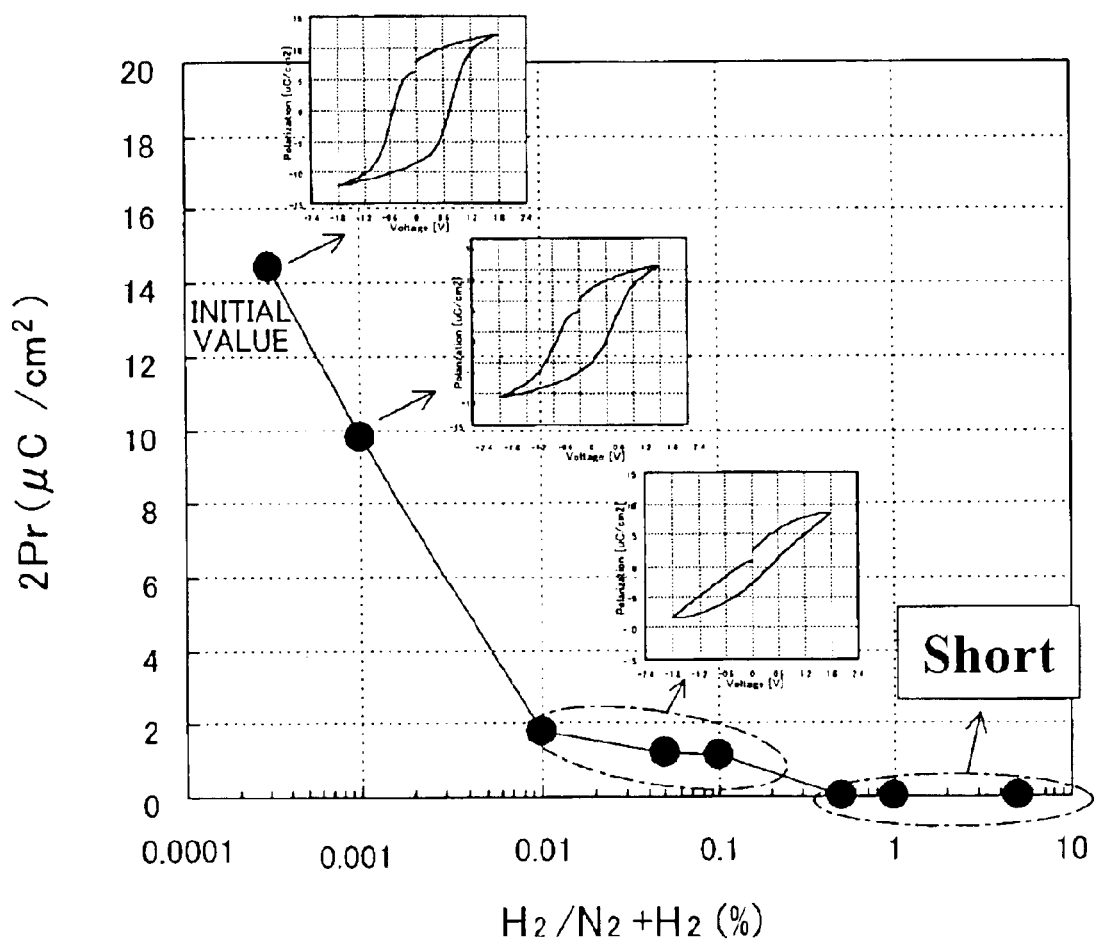
FIG. 18 is a view showing the degree of degradation of the polarization observed when heat treatment at 400° C. in a hydrogen atmosphere is performed for a ferroelectric capacitor having a bottom electrode made of Pt, a capacitor insulating film made of SBT and a top electrode made of Pt.
Figure 19:
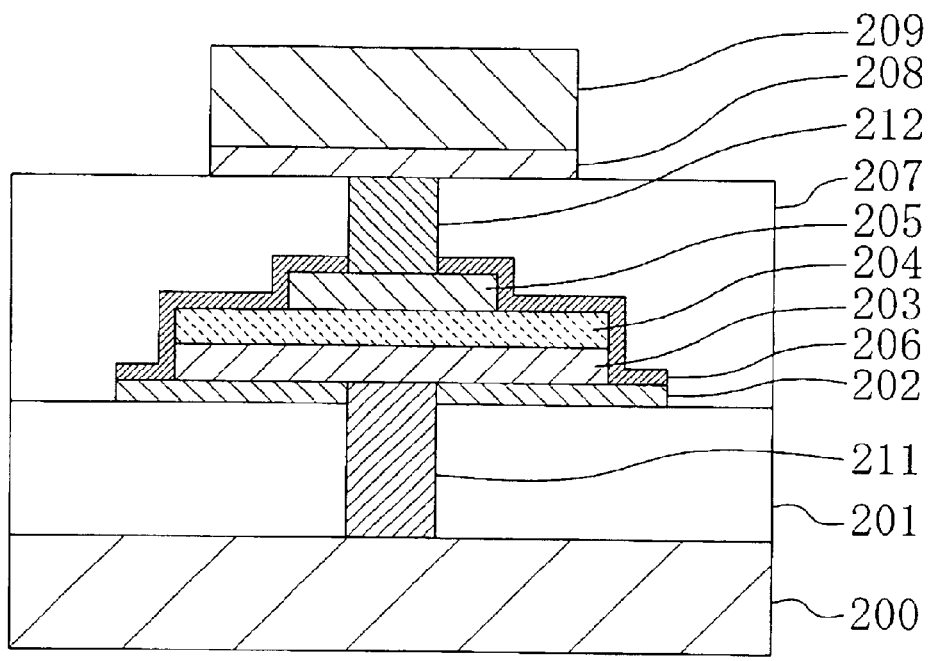
FIG. 19 is a cross-sectional view of a conventional ferroelectric capacitor.
Figure 20:
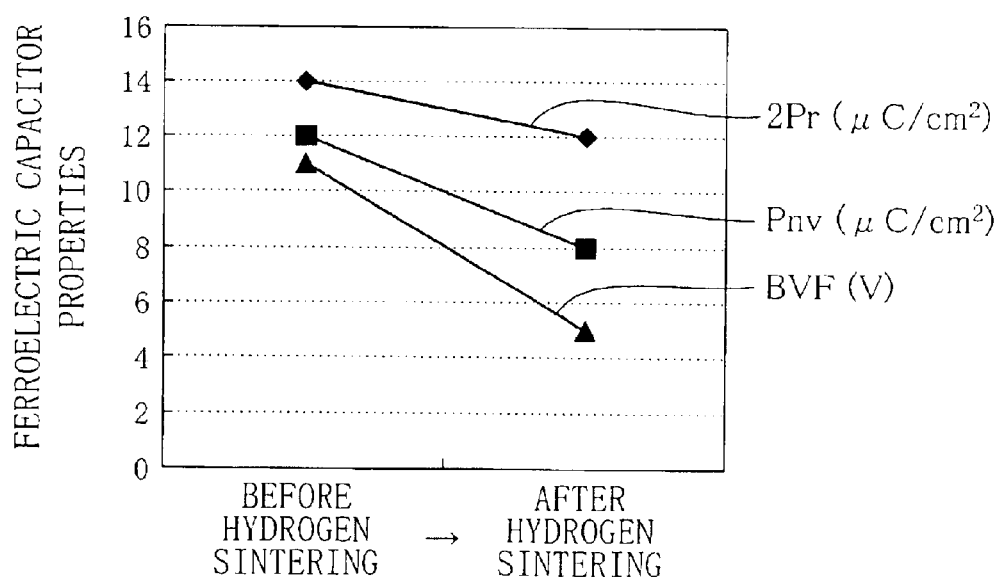
FIG. 20 is a view showing the properties of a ferroelectric capacitor covered with hydrogen barrier films, observed before and after the ferroelectric capacitor is subjected to heat treatment in a hydrogen atmosphere.

Thereafter, the capacitor insulating film 85A is subjected to heat treatment at high temperature in an oxygen atmosphere, to crystallize the ferroelectric film constituting the capacitor insulating film 85A and place the hydrogen-absorbing element contained in the hydrogen-absorbing element containing film 87 in grain boundaries, inter-lattice positions or holes of the ferroelectric film, to obtain a crystallized capacitor insulating film 85B as shown in FIG. 17C. The temperature for the high-temperature heat treatment is in the range of about 650° C. to about 800° C. when the ferroelectric film is made of SBT. This heat treatment is performed for the capacitor insulating film 85A in the oxygen atmosphere. Therefore, the hydrogen-absorbing element is bonded with oxygen to stay in a stable state.

In Embodiment 10, the capacitor insulating film 85A is subjected to heat treatment to crystallize the ferroelectric film and place the hydrogen-absorbing element contained in the hydrogen-absorbing element containing film 87 in grain boundaries, inter-lattice positions or holes of the ferroelectric film. Therefore, when the capacitor of the laminated structure composed of the bottom electrode 83A, the capacitor insulating film 85B and the top electrode 86A is subjected to heat treatment in a hydrogen atmosphere, hydrogen entering the capacitor insulating film 85B, if any, is absorbed by the hydrogen-absorbing element. Thus, degradation of the polarization property of the capacitor insulating film 85B due to hydrogen can be prevented.

The capacitor obtained in Embodiment 10 had a structure that the bottom electrode 83A serves as the electrode defining the capacitance. Alternatively, a structure that the top electrode 86A serves as the electrode defining the capacitance may be adopted.

In Embodiments 1 to 10, SBT (SrBiTaO) was used for formation of the capacitor insulating film. Alternatively, PbZrTiO (PZT), BiLaTiO (BLT) or BaSrTiO (BST) may be used. Otherwise, a high dielectric may be used.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A capacitor having a laminated structure including a bottom electrode, a capacitor insulating film composed of a ferroelectric film or a high dielectric constant film formed on the bottom electrode, and a top electrode formed on the capacitor insulating film, wherein the capacitor insulating film contains an element for absorbing hydrogen, said element being distinct from the ferroelectric film or the high dielectric constant film.

2. The capacitor of claim 1, wherein said element is contained in grain boundaries, inter-lattice positions or holes of the capacitor insulating film.

3. The capacitor of claim 1, wherein said element is bonded with oxygen.

4. The capacitor of claim 1, wherein the capacitor insulating film is made of SBT, and said element is at least one selected from the group consisting of Sc, Ti, V, Y, Zr, Nb and La.

5. The capacitor of claim 1, further comprising a hydrogen barrier film covering at least part of the laminated structure.

* * * * *